(12) United States Patent
Seok et al.

(10) Patent No.: US 12,219,703 B2
(45) Date of Patent: *Feb. 4, 2025

(54) PRINTED CIRCUIT BOARD

(71) Applicant: Samsung Electronics Co., Ltd., Suwon-si (KR)

(72) Inventors: Jonghyun Seok, Seoul (KR); Kyeongseon Park, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/503,974

(22) Filed: Nov. 7, 2023

(65) Prior Publication Data

US 2024/0074051 A1  Feb. 29, 2024

Related U.S. Application Data

(63) Continuation of application No. 17/672,979, filed on Feb. 16, 2022, now Pat. No. 11,844,176.

(30) Foreign Application Priority Data

Jun. 24, 2021 (KR) .................. 10-2021-0082387
Oct. 6, 2021 (KR) .................. 10-2021-0132221

(51) Int. Cl.
*H05K 1/11* (2006.01)

(52) U.S. Cl.
CPC .... *H05K 1/111* (2013.01); *H05K 2201/09409* (2013.01)

(58) Field of Classification Search
CPC ................ H05K 1/11; H05K 2201/09409

USPC ........................................ 361/767
See application file for complete search history.

(56) References Cited

U.S. PATENT DOCUMENTS

| 9,288,906 | B2 | 3/2016 | Lee et al. |
| 2010/0062548 | A1* | 3/2010 | Kwon ................ H01L 23/544 |
| | | | 257/E23.179 |
| 2015/0136464 | A1 | 5/2015 | Shimizu et al. |
| 2015/0311148 | A1* | 10/2015 | Jung ................ H01L 23/49838 |
| | | | 361/767 |

FOREIGN PATENT DOCUMENTS

| JP | 2000286132 A | 10/2000 |
| JP | 2007012680 A | 1/2007 |
| JP | 2009111108 A | 5/2009 |
| JP | 2015099815 A | 5/2015 |
| JP | 2016086066 A | 5/2016 |
| JP | 2021048179 B | 3/2021 |
| KR | 2003-0067738 A | 8/2003 |
| WO | 2002/0548385 A1 | 7/2002 |

* cited by examiner

*Primary Examiner* — Andargie M Aychillhum
(74) *Attorney, Agent, or Firm* — Muir Patent Law, PLLC

(57) ABSTRACT

A printed circuit board includes: a base substrate; a pad region having a plurality of pad patterns disposed on one surface of the base substrate; and a dummy region having a plurality of conductive dummy patterns separated from the plurality of pad patterns to be disposed on the one surface of the base substrate. The pad region includes a first edge region, and a second edge region disposed in a diagonal direction of the first edge region on the one surface of the base substrate. The dummy region includes a third edge region, and a fourth edge region disposed in a diagonal direction of the third edge region on the one surface of the base substrate.

20 Claims, 17 Drawing Sheets

PRINTED CIRCUIT BOARD

CROSS-REFERENCE TO RELATED APPLICATIONS

This application is a continuation application of U.S. patent application Ser. No. 17/627,979, filed Feb. 16, 2022, which claims benefit of priority to Korean Patent Application No. 10-2021-0082387, filed on Jun. 24, 2021, in the Korean Intellectual Property Office, and Korean Patent Application No. 10-2021-0132221, filed on Oct. 6, 2021, in the Korean Intellectual Property Office, the disclosures of each of which are incorporated herein by reference in their entirety.

BACKGROUND

1. Field

Embodiments relate to a printed circuit board.

2. Description of the Related Art

A printed circuit board (PCB) may include a base substrate, having insulating properties, and a circuit pattern formed on the base substrate. A semiconductor device in the form of chip or a circuit device in the form of chip may be mounted on the printed circuit board, and the circuit pattern may transmit a signal of a semiconductor chip. A mounting direction of a semiconductor chip, mounted on the printed circuit board, may be determined to a predetermined direction. When the semiconductor chip is mounted in a direction different from the predetermined direction, defects of a memory module including the printed circuit board and the semiconductor chip may occur. A marking process of marking a mounting direction on an upper surface of a semiconductor chip may be performed to prevent a mounting defect of the semiconductor chip. However, such a method may cause an increase in processing time of the semiconductor chip and an increase in fabrication costs of the semiconductor chip.

SUMMARY

According to an embodiment, a printed circuit board includes: a base substrate having a first side and a second side, extending in a first direction and parallel to each other, and a third side and a fourth side extending in a second direction, perpendicular to the first direction, and parallel to each other; a pad region having a plurality of pad patterns disposed on one surface of the base substrate; and a dummy region having a plurality of conductive dummy patterns separated from the plurality of pad patterns to be disposed on the one surface of the base substrate. The pad region includes a first edge region adjacent to an intersection of the first side and the third side, and a second edge region disposed in a diagonal direction of the first edge region on the one surface of the base substrate. The dummy region includes a third edge region adjacent to an intersection of the first side and the fourth side, and a fourth edge region disposed in a diagonal direction of the third edge region on the one surface of the base substrate.

According to an embodiment, a printed circuit board includes: a base substrate having a first side and a second side, extending in a first direction and parallel to each other, and a third side and a fourth side extending in a second direction, perpendicular to the first direction, and parallel to each other; and a pad region having a plurality of pad patterns disposed on one surface of the base substrate. The pad region includes a first pad region, including a first edge region adjacent to an intersection of the first side and the third side and a first sub-pad region spaced apart from the second side and the fourth side, and a second pad region, including a second edge region disposed in a diagonal direction of the first edge region on the one surface of the base substrate and a second sub-pad region spaced apart from the first side and the third side.

According to an embodiment, a printed circuit board includes: a base substrate having a first side and a second side, extending in a first direction and parallel to each other, and a third side and a fourth side extending in a second direction, perpendicular to the first direction, and parallel to each other; and a pad region including a first edge region having a plurality of pad patterns disposed on one surface of the base substrate and adjacent to an intersection of the first side and the third side, and a second edge region disposed in a diagonal direction of the first edge region on the one surface of the base substrate. The pad region does not include a third edge region, adjacent to an intersection of the first side and the fourth side, and a fourth edge region disposed in a diagonal direction of the third edge region on the one surface of the base substrate.

BRIEF DESCRIPTION OF DRAWINGS

Features will become apparent to those of skill in the art by describing in detail example embodiments with reference to the attached drawings in which.

DETAILED DESCRIPTION

Figure 1A:
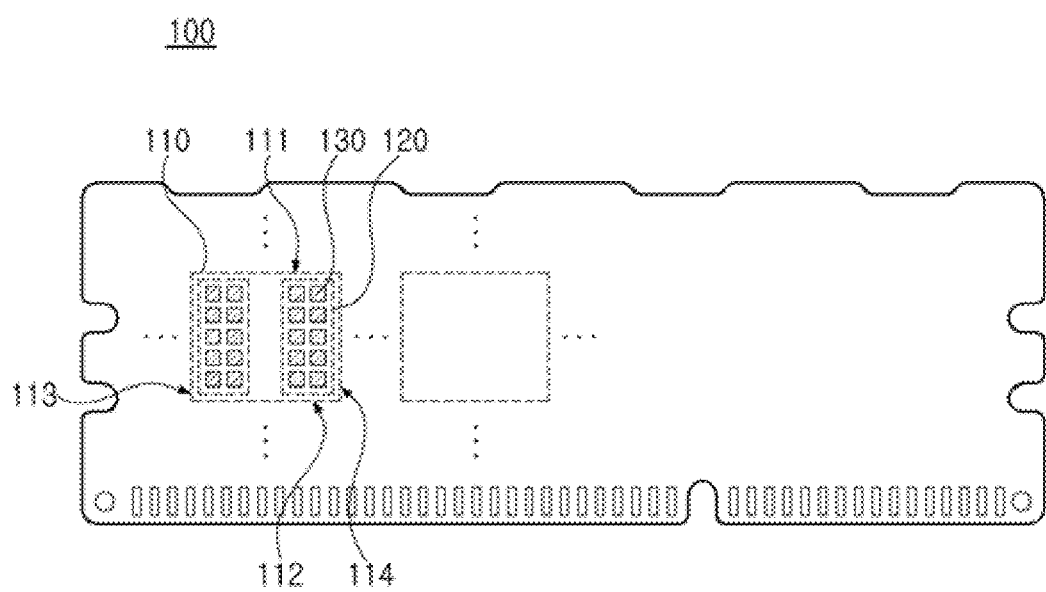
FIG. 1A is a schematic diagram of a printed circuit board according to a comparative example.
Figure 1B:
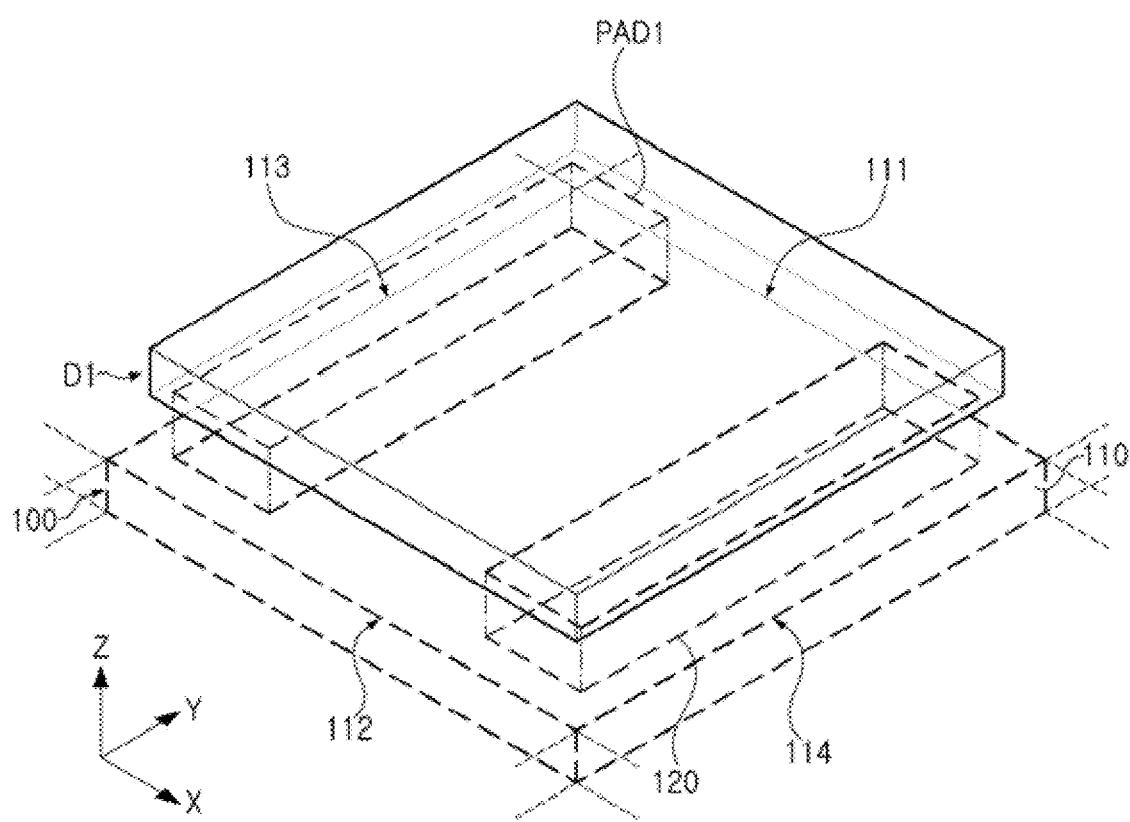
FIGS. 1B and 1C are diagrams illustrating the case in which a semiconductor device or a circuit device is mounted on the printed circuit board according to the comparative example.
Figure 1C:
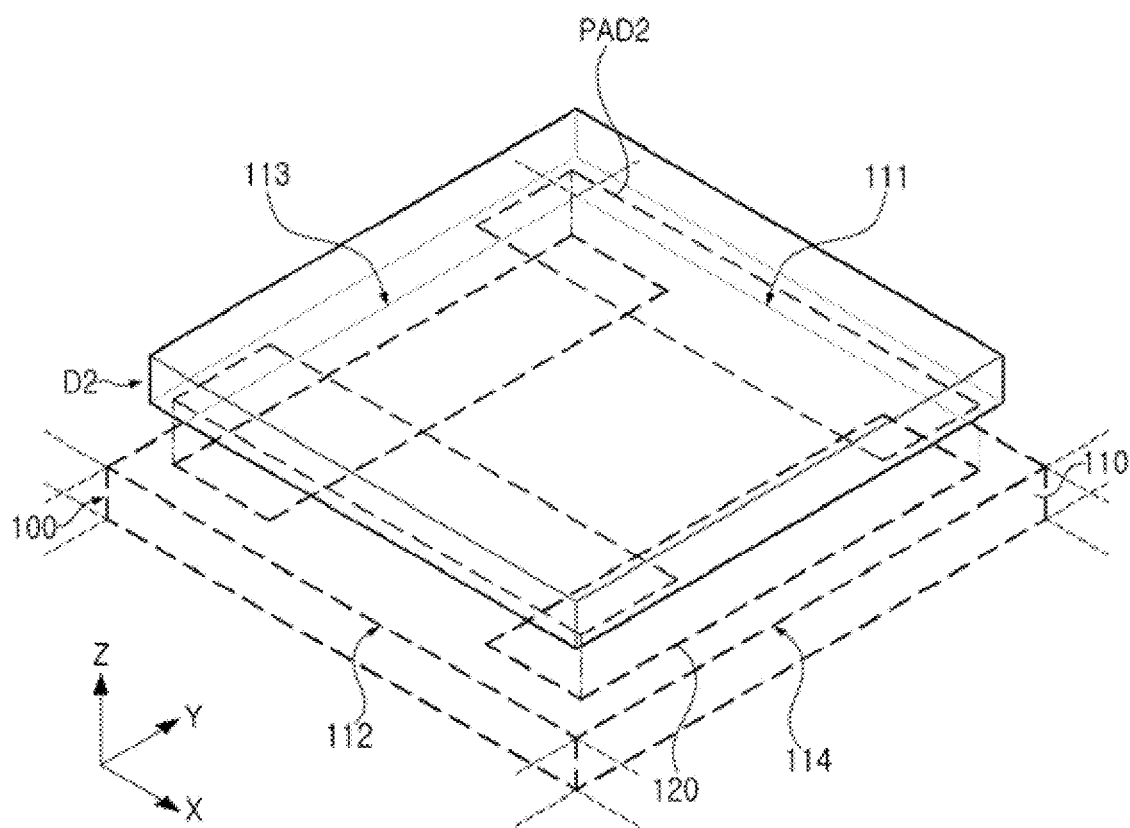

FIG. 1A is a schematic diagram of a printed circuit board according to a comparative example. FIGS. 1B and 1C are diagrams illustrating the case in which a semiconductor device or a circuit device is mounted on the printed circuit board according to the comparative example.

Referring to FIG. 1A, a printed circuit board 100 according to a comparative example may be a component of a memory module including a plurality of memory chips and a register chip.

A region of the printed circuit board 100, on which a semiconductor device or a circuit device in the form of chip is mounted, may be defined as a base board or base substrate 110.

The printed circuit board 100 may include the base substrate 110 and a plurality of circuit patterns formed on the base substrate 110. The plurality of circuit patterns may be formed in a circuit region to be connected to a plurality of pad patterns 130 formed in a pad region 120. The plurality of pad patterns 130 may be connected to pads formed on the semiconductor chip through microbumps, or the like.

The base substrate 110 may have a first side 111 and a second side 112, extending side by side in a first direction (for example, an X direction), and a third side 113 and a fourth side 114 extending side by side in a second direction (for example, a Y direction), perpendicular to the first direction. The plurality of pad patterns 130 may be disposed in the pad region 120 adjacent to the third and fourth sides 113 and 114 parallel to each other.

A dummy region, distinguished from a circuit region, may be defined as a region in which circuit patterns are not formed. For example, the dummy region may be defined as a remaining region, other than the circuit region. The dummy region may have conductive dummy patterns disposed on the base substrate 110. The conductive dummy patterns may include a conductive metal layer, e.g., a copper layer in a predetermined ratio, and the copper layer may be formed in a predetermined pattern.

Referring to FIGS. 1B and 1C, the pad region 120 included in the printed circuit board 100 according to the comparative example may extend in the second direction to be adjacent to the third side 113 and the fourth side 114 of the base substrate 110. A semiconductor device or a circuit device D1 (FIG. 1B) or a semiconductor device or a circuit device D2 (FIG. 1C) in the form of a chip may be mounted on the printed circuit board 100. Hereinafter, "the semiconductor device or the circuit device D1 or the semiconductor device or the circuit device D2" will be simply referred to as "the semiconductor device or the circuit device D1 or D2."

The semiconductor device or the circuit device D1 or D2 may include conductive pads PAD1 and PAD2 electrically connected to the printed circuit board 100 through the pad region 120 of the printed circuit board 100. The conductive pads PAD1 and PAD2 of the semiconductor device or the circuit device D1 or D2 may include a pair of electrodes extending side by side in one direction to be adjacent to a pair of sides, similarly to the pad region 120 of the printed circuit board 100, without distinction of polarity.

A structure, in which the semiconductor devices or the circuit devices D1 or D2 and the printed circuit board 100 are connected to each other, may vary, depending on a mounting angle of the semiconductor device or the circuit device D1 or D2. The semiconductor device or the circuit device D1 mounted on the printed circuit board 100 illustrated in FIG. 1B may be considered as being mounted at a normal mounting angle, whereas the semiconductor device or the circuit device D2 mounted on the printed circuit board 100 illustrated in FIG. 1C may be considered as being mounted at an incorrect mounting angle. Further, since polarities of the pads PAD1 and PAD2 of the semiconductor device or the circuit device D1 or D2 are not distinguished, there may be a case in which the semiconductor device or the circuit device D1 mounted to be normal is rotated 180 degrees and 360 degrees with respect to the first side 111, and there may be a case in which the semiconductor device or the circuit device D2 mounted to be twisted is rotated 90 degrees and 270 degrees with respect to the first side 111.

The semiconductor device or the circuit device D1 and the semiconductor device or the circuit device D2 may have an apparently symmetrical structure and an upper surface on which a mounting direction is not marked. In the case in which the semiconductor device or the circuit device D1 and the semiconductor device or the circuit device D2 is rotated 90 degrees, 180 degrees, 270 degrees, and 360 degrees with respect to the first side 111, the semiconductor device or the circuit device D1 and the semiconductor device or the circuit device D2 may look alike in appearance. Accordingly, the mounting angles of the semiconductor device or the circuit device D1 and the semiconductor device or the device D2 may be problematic, particularly when mounting the semiconductor device or the circuit device D1 or D2 having an apparently symmetrical structure and having an upper surface on which the mounting direction is not marked.

As described above, the semiconductor device or the circuit device D1 or D2 mounted on the printed circuit board may be a device having an apparently symmetrical structure and having an upper surface on which a mounting direction is not marked. The semiconductor device or the circuit device D1 or D2 may be, e.g., an inductor device or another device which may be mounted on a printed circuit board.

Referring to FIG. 1B, the semiconductor device or the circuit device D1 mounted on the printed circuit board 100 according to the comparative example may be disposed in such a manner that the pad region 120 included in the printed circuit board 100 and the pad PAD1 of the semiconductor device or the circuit device D1 correspond to each other. Accordingly, the semiconductor device or the circuit device D1 mounted on the printed circuit board 100 illustrated in FIG. 1B may operate normally.

Meanwhile, referring to FIG. 1C, the semiconductor device or the circuit device D2 mounted on the printed circuit board 100 according to the comparative example may be disposed in such a manner that the pad region 120 included in the printed circuit board 100 and the semiconductor device or the circuit device D2 intersect each other. Accordingly, pads PAD2 of the semiconductor device or the circuit device D2 mounted on the printed circuit board 100 illustrated in FIG. 1B may be electrically connected to each other, and short-circuits may occur in the semiconductor device or the circuit device D2.

At the printed circuit board 100 illustrated in FIG. 1C, overcurrent may be generated in the printed circuit board 100 on which the semiconductor device or the circuit device D2 having short-circuit during operation of the printed circuit board 100, and thus, the printed circuit board 100 may abnormally operate. To determine whether the printed circuit board 100 is operating normally, an automated inspection apparatus such as an automated optical inspection (AOI) system or an automated visual inspection (AVI)

system may be used to inspect whether the semiconductor device or the circuit devices D1 and the semiconductor device or the circuit device D2 are incorrectly mounted.

However, in the case of a device, having an apparently symmetrical structure and having an upper surface on which a mounting direction is not marked, such as the semiconductor device or the circuit device D1 or D2 illustrated in FIG. 1B or 1C, it may be difficult to determine whether the semiconductor device or the circuit device D1 or D2 is incorrectly mounted, using an automated inspection apparatus. In addition, when a marking process of marking a mounting direction on an upper surface of the device is further performed using an automated inspection apparatus to determine whether the device is incorrectly mounted, a manufacturing process schedule of a memory module including the printed circuit board, on which the device is mounted, may be delayed and manufacturing costs may be increased.

Figure 2:
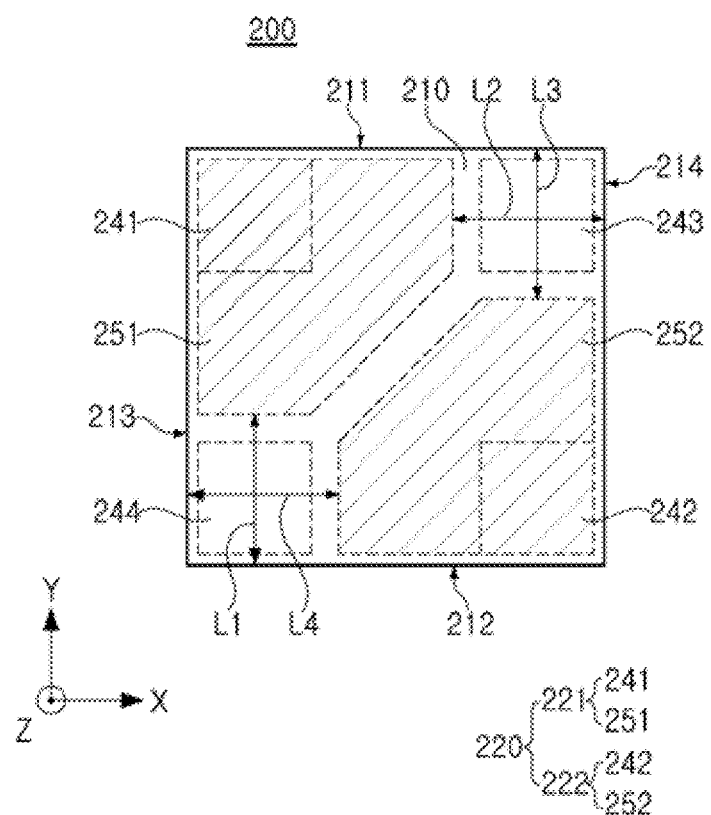
FIG. 2 is a schematic plan view of a printed circuit board according to an example embodiment.

FIG. 2 is a schematic plan view of a printed circuit board according to an example embodiment.

Referring to FIG. 2, a printed circuit board 200 according to an example embodiment may include a base substrate 210 and a pad region 220 including a plurality of pad patterns disposed on one surface of the base substrate 210.

FIG. 2 merely illustrates an example of an upper surface of the printed circuit board 200 for brevity of drawing, and a configuration of the printed circuit board 200 may be varied, e.g., the printed circuit board 200 may further include additional regions such as a circuit region, a dummy region, and the like, and may further include additional components used for operation of a memory module including the printed circuit board 200.

In the printed circuit board 200, the base substrate 210 may include a first side 211 and a second side 212 extending in a first direction (for example, an X direction), and a third side 213 and a fourth side 214 extending in a second direction (for example, a Y direction), perpendicular to the first direction.

In the base substrate 210, intersections of the sides 211, 212, 213 and 214, e.g., regions adjacent to the four sides, may be defined as a first edge region 241, a second edge region 242, a third edge region 243, and a fourth edge region 244, respectively. The first edge region 241 and the second edge region 242 may be disposed in a diagonal direction, and the third edge region 243 and the fourth edge region 244 may be disposed in a diagonal direction.

The pad region 220 may include a first pad region 221, which includes the first edge region 241, and a second pad region 222, which includes the second edge region 242.

The first pad region 221 and the second pad region 222 may be electrically connected to electrodes of a semiconductor device or a circuit device mounted on the printed circuit board 200, respectively.

The first pad region 221 and the second pad region 222 may be electrically separated from each other to prevent short-circuit between the electrodes of the semiconductor device or the circuit device. For example, the first pad region 221 and the second pad region 222 may be separated from each other in a diagonal direction, intersecting the first direction and the second direction.

The first pad region 221 and the second pad region 222 may have the same area. The first pad region 221 and the second pad region 222 may be point-symmetrical with respect to a center of the base substrate 210. For example, a shape of the printed circuit board 200 including the first pad region 221 and the second pad region 222 may be the same as a shape when the printed circuit board 200 is rotated 180 degrees.

In other implementations, the shape of the pad region 220 may be variously modified under the condition that the first pad region 221 of the printed circuit board 200 includes the first edge region 241, the second pad region 222 includes the second edge region 242, and the pad region 221 and the second pad region 222 do not include the third edge region 243 and the fourth edge region 244.

An area of the pad region 220 that is electrically connected to the electrodes of the semiconductor device or the circuit device may be directly related to performance of the memory module including the printed circuit board 200 and the semiconductor device or the circuit device mounted on the printed circuit board 200. As an example, the larger the area of the pad region 220 electrically connected to the electrodes of the semiconductor device or the circuit device is, the higher the performance of the memory module may be. In this regard, the first pad region 221 may further include a first sub-pad region 251 extending from the first edge region 241, and the second pad region 222 may further include a second sub-pad region 252 extending from the second edge region 242.

The first sub-pad region 251 may be spaced apart from the second side 212 by a first length L1, and may be spaced apart from the fourth side 214 by a second length L2.

Similarly, the second sub-pad region 252 may be spaced apart from the first side 211 by a third length L3 and may be spaced apart from the third side 213 by a fourth length L4.

The first length L1, the second length L2, the third length L3, and the fourth length L4 may be equal to each other, but may be different from each other.

The first length L1, the second length L2, the third length L3, and the fourth length L4, corresponding to the separation distances between the sub-pad regions 251 and 252 and the sides 211, 212, 213 and 214, may be greater than a predetermined value. The predetermined value may be a width of electrodes of a semiconductor device or a circuit device electrically connected to each of the first pad region 221 and the second pad region 222. Accordingly, each of the first pad region 221 and the second pad region 222 may be electrically connected to only one of the electrodes of the semiconductor device or the circuit device.

In other words, the first sub-pad region 251 of the printed circuit board 200 may be formed to be spaced apart from one of the first and second sides 211 and 212 parallel to each other. The second sub-pad region 252 may be formed to be spaced apart from one of the third and fourth sides 213 and 214 parallel to each other. Accordingly, the above-mentioned short-circuit may be prevented and electrical defects may be prevented from occurring (without the need to improve an automated inspection apparatus such as an AOI system, an AVI system, or the like, and/or perform a marking process on the upper surface of the semiconductor device or the circuit device), regardless of a mounting angle of the semiconductor device or the circuit device mounted on the printed circuit board 200.

Figure 3:
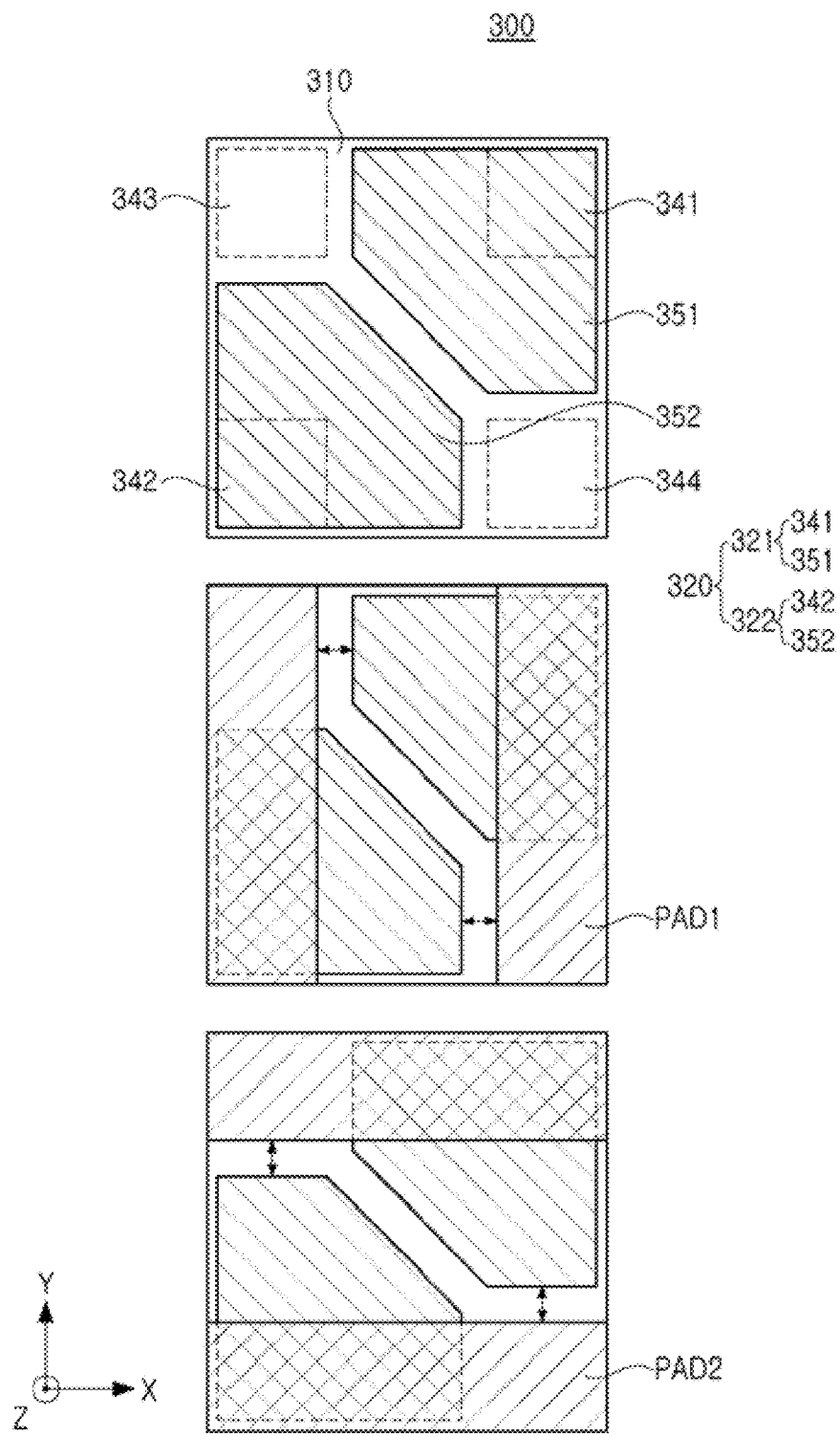
FIGS. 3 and 4 are plan views, each illustrating a printed circuit board according to an example embodiment and the case in which a semiconductor device or a circuit device is mounted on the printed circuit board.
Figure 4:
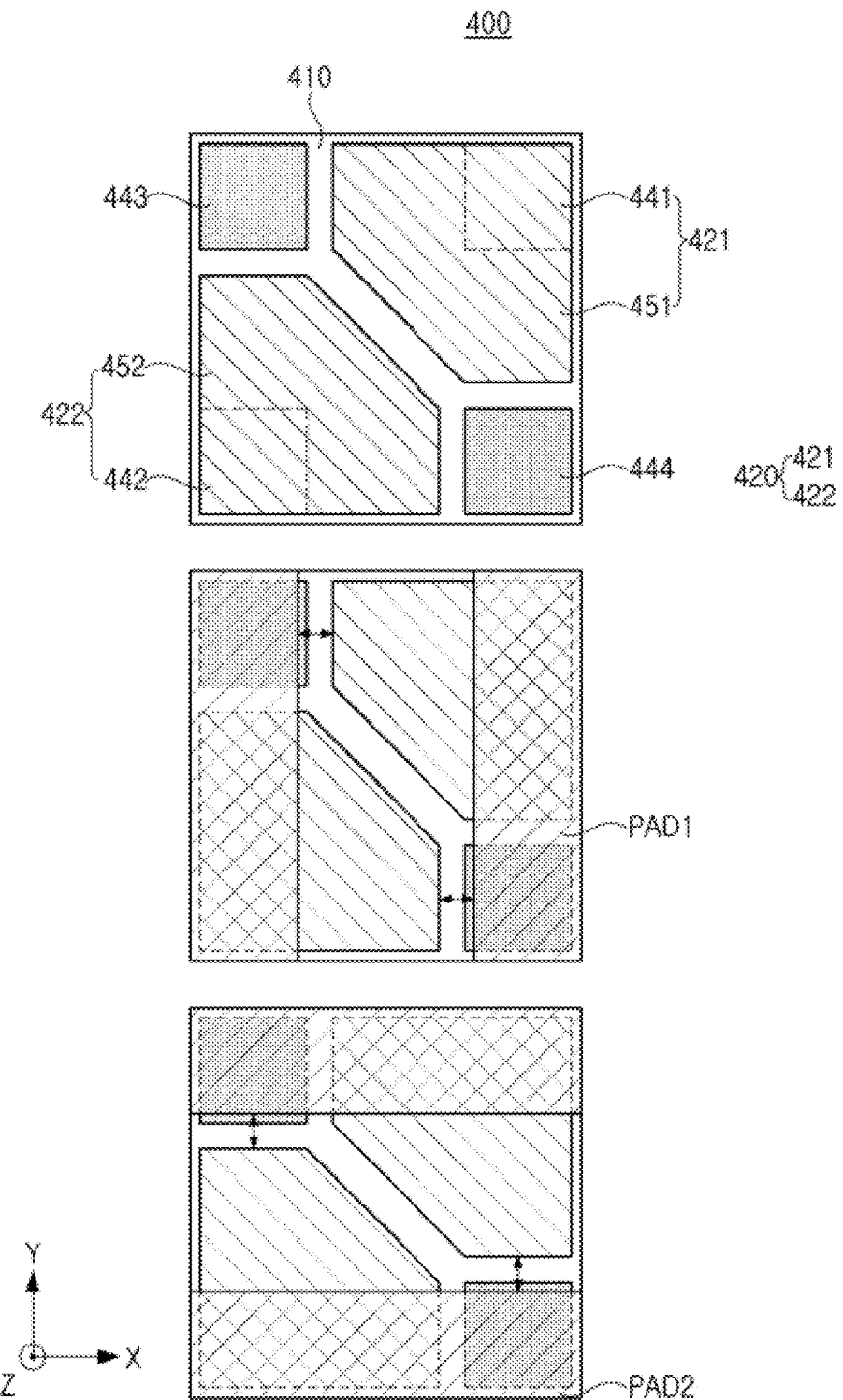

FIGS. 3 and 4 are plan views, each illustrating a printed circuit board according to an example embodiment and the case in which a semiconductor device or a circuit device is mounted on the printed circuit board.

Referring to FIG. 3, a printed circuit board 300 according to an example embodiment may correspond to the printed circuit board 200 illustrated in FIG. 2.

The printed circuit board 300 may include a base substrate 310 and a pad region 320 including a plurality of pad patterns disposed on one surface of the base substrate 310.

As compared with the printed circuit board 20 illustrated in FIG. 2, the printed circuit board 300 illustrated in FIG. 3, positions of a first pad region 321 and a second pad region 322 are changed. The other components may correspond to those of the printed circuit board 200 illustrated in FIG. 2.

Regions adjacent to four sides of the printed circuit board 300 may be defined as a first edge region 341, a second edge region 342, a third edge region 343, and a fourth edge region 344, respectively. The first edge region 341 and the second edge region 342 may be disposed in a diagonal direction, and the third edge region 343 and the fourth edge region 344 may be disposed in a diagonal direction.

The pad region 320 may include a first pad region 321, which includes a first edge region 341 and a first sub-pad region 351, and a second pad region 322, which includes a second edge region 342 and a second sub-pad region 352. The first pad region 321 and the second pad region 322 may be electrically separated from each other.

A semiconductor device or a circuit device may be mounted on the printed circuit board 300. In a third direction (for example, a Z direction) perpendicular to an upper surface of a base substrate 310, at least a portion of the first pad region 321 may overlap at least a portion of one electrode of the semiconductor device or the circuit device mounted on the printed circuit board 300, and at least a portion of the second pad region 322 may overlap at least a portion of another electrode of the semiconductor device or the circuit device.

A mounting angle of the semiconductor device or the circuit device may be 90 degrees, 180 degrees, 270 degrees, or 360 degrees with respect to sides adjacent to the first and third edge regions 341 and 343. When the mounting angle of the semiconductor device and the circuit device is 180 degrees or 360 degrees, electrodes corresponding to a pad PAD1 of the semiconductor device or the circuit device may be electrically connected to the first pad region 321 and the second pad region 322, respectively. Even when the mounting angle of the semiconductor device and the circuit device is 90 degrees or 270 degrees, electrodes corresponding to a pad PAD2 of the semiconductor device or the circuit device may be electrically connected to the first pad region 321 and the second pad region 322.

With the use of the printed circuit board 300, the electrodes corresponding to the pads PAD1 and PAD2 of the semiconductor device or the circuit device may be electrically connected to the first pad region 321 and the second pad region 322, respectively, regardless of a mounting angle at which the semiconductor device or the circuit device is mounted. Accordingly, when the semiconductor device or the circuit device, e.g., a device having the same exterior is mounted, short-circuit in which the first pad region 321 and the second pad region 322 are electrically connected to each other may be prevented regardless of the mounting angle.

Referring to FIG. 4, a printed circuit board 400 according to an example embodiment may correspond to the printed circuit board 300 illustrated in FIG. 3.

The printed circuit board 400 may include a base substrate 410 and a pad region 420 including a plurality of pad patterns disposed on one surface of the base substrate 410. In addition, the pad region 420 may include a first pad region 421, which includes a first edge region 441 and a first sub-pad region 451, and a second pad region 422, which includes a second edge region 442 and a second sub-pad region 452.

Unlike the printed circuit board 300 illustrated in FIG. 3, the printed circuit board 400 may include a dummy region formed in the third edge region 443 and the fourth edge region 444. For example, the printed circuit board 400 may include the third edge region 443 and the fourth edge region 444 and may include a dummy region having a plurality of conductive dummy patterns separated from a plurality of pad patterns to be disposed on one surface of the base substrate 410, so that the first pad region 421 and the second pad region 422 may be electrically separated from each other more clearly and, furthermore, operational performance of the memory module including the printed circuit board 400 may be improved.

Figure 5A:
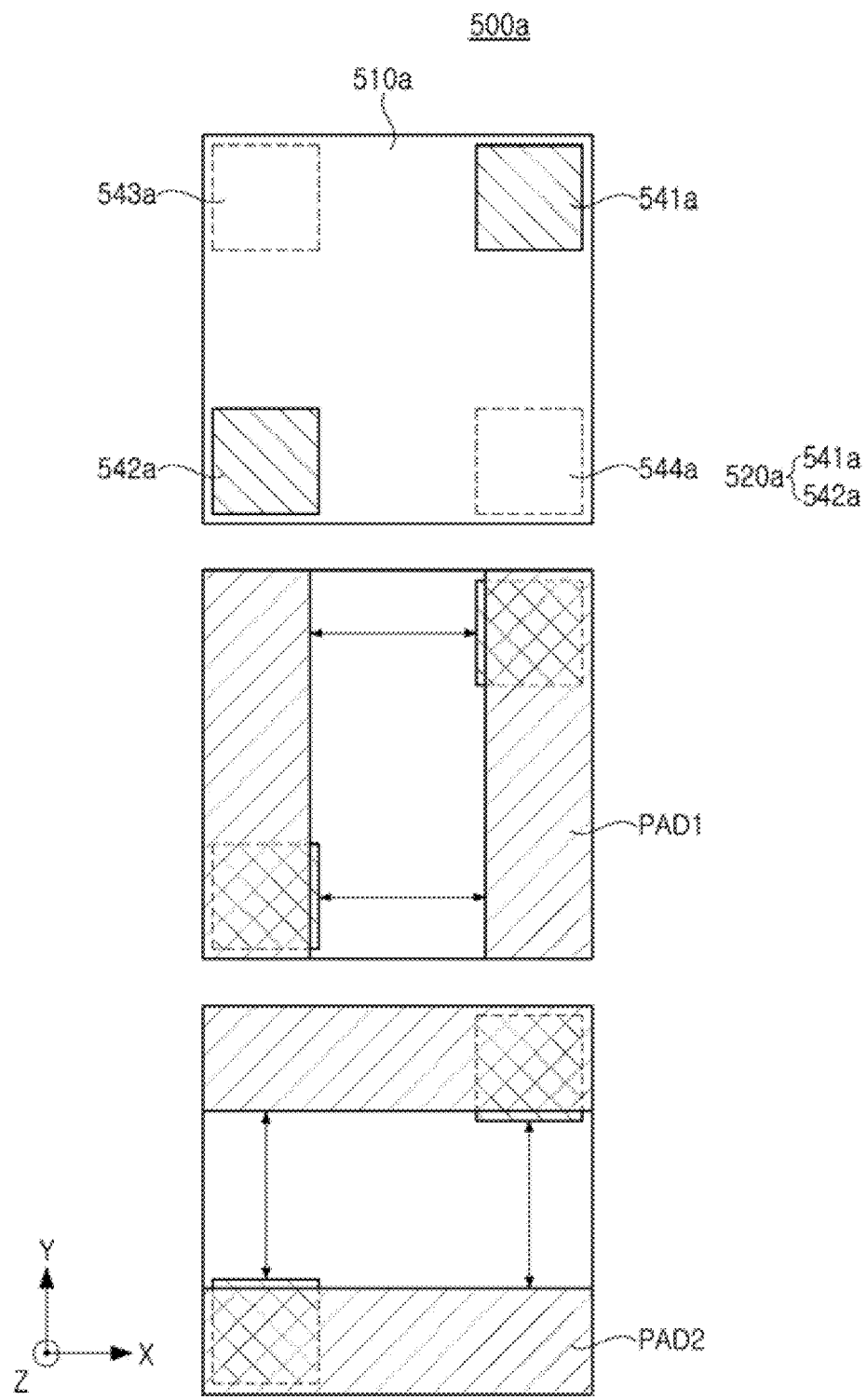
FIGS. 5A and 5B are plan views, each illustrating a printed circuit board according to an example embodiment and the case in which a semiconductor device or a circuit device is mounted on the printed circuit board.
Figure 5B:
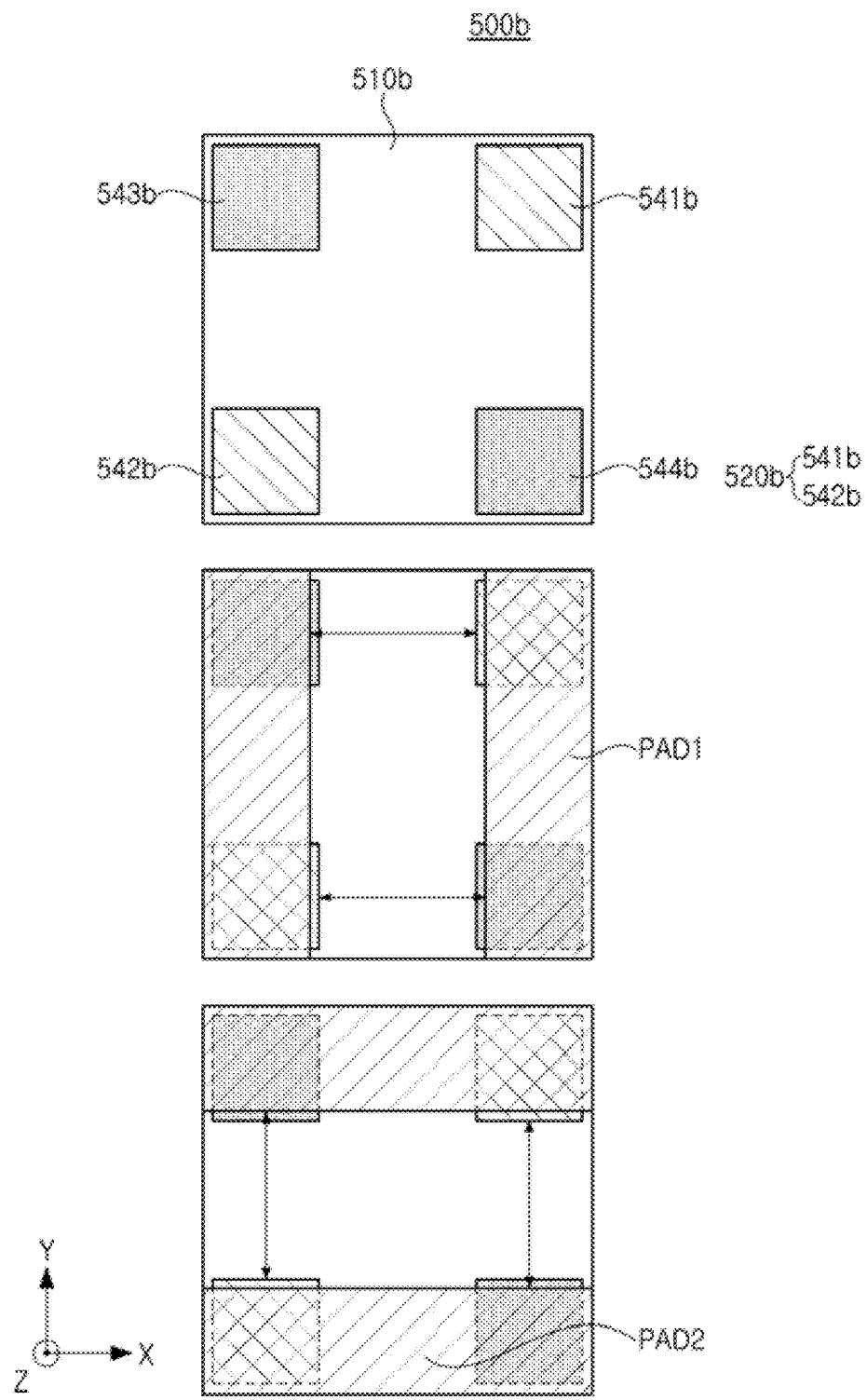

FIGS. 5A and 5B are plan views, each illustrating a printed circuit board according to an example embodiment and the case in which a semiconductor device or a circuit device is mounted on the printed circuit board.

Referring to FIG. 5A, a printed circuit board 500a according to an example embodiment may correspond to the printed circuit board 300 illustrated in FIG. 3.

The printed circuit board 500a may include a base substrate 510a and a pad region 520a including a plurality of pad patterns disposed on one surface of the base substrate 510a.

As compared with the printed circuit board 300 illustrated in FIG. 3, the printed circuit board 500a illustrated in FIG. 5A has a first pad region which includes only a first edge region 341 and a second pad region 322 includes only a second edge region 342. The other components may correspond to those of the printed circuit board 300 illustrated in FIG. 3.

Regions adjacent to four sides of the printed circuit board 500a may be defined as a first edge region 541a, a second edge region 542a, a third edge region 543a, and a fourth edge region 544a. The first edge region 541a and the second edge region 542a may be disposed in a diagonal direction, and the third edge region 543a and the fourth edge region 544a may be disposed in a diagonal direction.

The pad region 520a of the printed circuit board 500a may include the first edge region 541a and the second edge region 542a. The first edge region 541a and the second edge region 542a may be electrically separated from each other.

A semiconductor device or a circuit device may be mounted on the printed circuit board 500a. In a third direction (for example, a Z direction) perpendicular to an upper surface of the base substrate 510a, at least a portion of the first edge region 541a may overlap at least a portion of one electrode of the semiconductor device or the circuit device mounted on the printed circuit board 500a, and at least a portion of the second edge region 522 may overlap at least a portion of another electrode of the semiconductor device or the circuit device.

When a mounting angle of the semiconductor device or the circuit device is 180 degrees or 360 degrees with respect to a side adjacent to the first edge region 541a and the third edge region 543a, electrodes corresponding to a pad PAD1 of the semiconductor device or the circuit device may be electrically connected to the first edge region 541a and the second edge region 542a, respectively. Even when the mounting angle of the semiconductor device or the circuit device is 90 degrees or 270 degrees with respect to the side adjacent to the first edge region 541a and the third edge region 543a, electrodes corresponding to a pad PAD2 of the semiconductor device or the circuit device may be electrically connected to the first edge region 541a and the second edge region 542a, respectively.

With the use of the printed circuit board 500a, the electrodes corresponding to the pads PAD1 and PAD2 of the semiconductor device or the circuit device may be electrically connected to the first edge region 541a and the second edge region 542a, respectively, regardless of a mounting angle at which the semiconductor device or the circuit device is mounted. Accordingly, when the semiconductor device or the circuit device, e.g., a device having the same exterior is mounted, short-circuit in which the first edge region 541a and the second edge region 542a are electrically connected to each other may be prevented regardless of the mounting angle.

The printed circuit board 500a may not include a sub-pad region extending from the first edge region 541a and the second edge region 542a, so that a portion electrically separated from the pads PAD1 and PAD2 of the circuit device or the circuit device may be more clearly defined, which may be more advantageous in terms of stability than the memory module including the printed circuit board 300 illustrated in FIG. 3.

However, in the pad region 520a of the printed circuit board 500a, a portion electrically connected to the pads PAD1 and PAD2 of the semiconductor device or the circuit device may have a small area, which may be more disadvantageous in terms of performance than the memory module including the printed circuit board 300. This may be addressed by, e.g., a printed circuit board 500b as described below.

Referring to FIG. 5B, a printed circuit board 500b according to an example embodiment may correspond to the printed circuit board 500a illustrated in FIG. 5A.

The printed circuit board 500b may include a base substrate 510b and a pad region 520b including a plurality of pad patterns disposed on one surface of the base substrate 510b. The pad region 520b may include a first edge region 541b and a second edge region 542b.

Unlike the printed circuit board 500a illustrated in FIG. 5A, the printed circuit board 500b may include a dummy region formed in a third edge region 543b and a fourth edge region 544b. The printed circuit board 500b may include the third edge region 543b and the fourth edge region 544b, and may include a dummy region having a plurality of dummy patterns separated from a plurality of pad patterns to be disposed on one surface of the base substrate 510b, so that the first edge region 541b and the second edge region 542b may be electrically separated from each other more clearly and, furthermore, operational performance of the memory module including the printed circuit board 500b may be improved.

Figure 6:
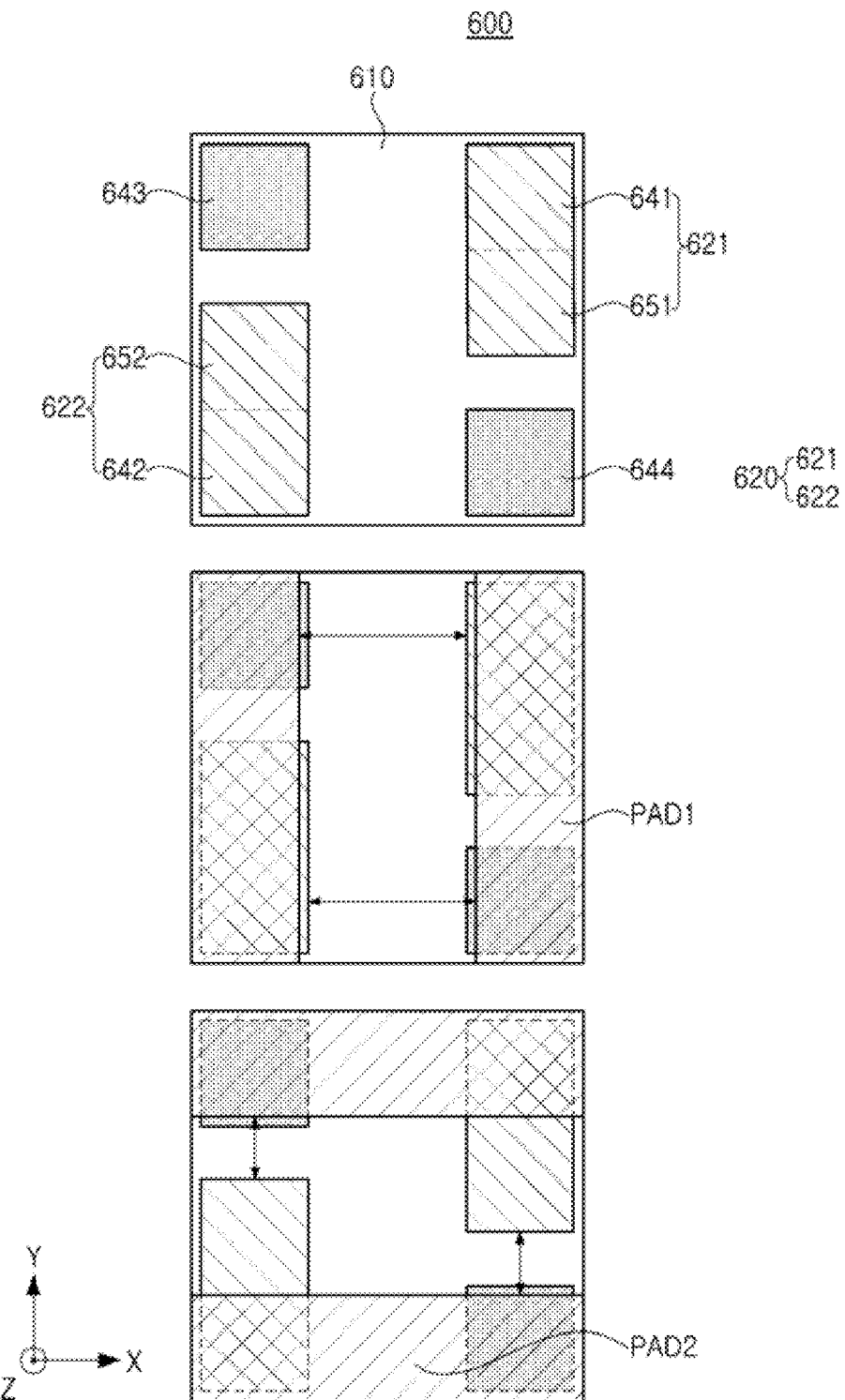
FIG. 6 is a plan view illustrating a printed circuit board according to an example embodiment and the case in which a semiconductor device or a circuit device is mounted on the printed circuit board.

FIG. 6 is a plan view illustrating a printed circuit board according to an example embodiment and the case in which a semiconductor device or a circuit device is mounted on the printed circuit board.

Referring to FIG. 6, a printed circuit board 600 according to an example embodiment may correspond to the printed circuit board 500b illustrated in FIG. 5B.

The printed circuit board 600 may include a base substrate 610, a pad region 620 including a plurality of pad patterns disposed on one surface of the base substrate 610, and a dummy region including a plurality of conductive dummy patterns disposed on one surface of the base substrate 610.

As compared with the printed circuit board 500b illustrated in FIG. 5B, the printed circuit board 600 illustrated in FIG. 6 has the pad region 620 which further includes a first sub-pad region 651 and a second sub-pad region 652. The first sub-pad region 651 and the second sub-pad region 652 may extend from a first edge region 641 and a second edge region 642 in a second direction (for example, a Y direction), respectively.

The pad region 620 may include a first pad region 621, which includes the first edge region 641 and the first sub-pad region 651, and a second pad region 622, which includes the second edge region 642 and the second sub-pad region 652. The first pad region 621 and the second pad region 622 may be electrically separated from each other. The dummy region may include a third edge region 643 and a fourth edge region 644.

A semiconductor device or a circuit device may be mounted on the printed circuit board 600. In a third direction (for example, a Z direction) perpendicular to an upper surface of the base substrate 610, at least a portion of the first pad region 621 may overlap at least a portion of one electrode of the semiconductor device or the circuit device mounted on the printed circuit board 600, and at least a portion of the second pad region 622 may overlap at least a portion of another electrode of the semiconductor device or the circuit device.

With the use of the printed circuit board 600, the electrodes corresponding to the pads PAD1 and PAD2 of the semiconductor device or the circuit device may be electrically connected to the first pad region 621 and the second pad region 622, respectively, regardless of a mounting angle at which the semiconductor device or the circuit device is mounted. Accordingly, when the semiconductor device or the circuit device, e.g., a device having the same exterior is mounted, short-circuit in which the first pad region 621 and the second pad region 622 are electrically connected to each other may be prevented regardless of the mounting angle.

The printed circuit board 600 may be applied with the pad region 620 further including the sub-pad regions 651 and 652, and thus, electrical characteristics of the printed circuit board 600 may be improved and operational performance of a memory module including the printed circuit board 600 may be improved.

Figure 7:
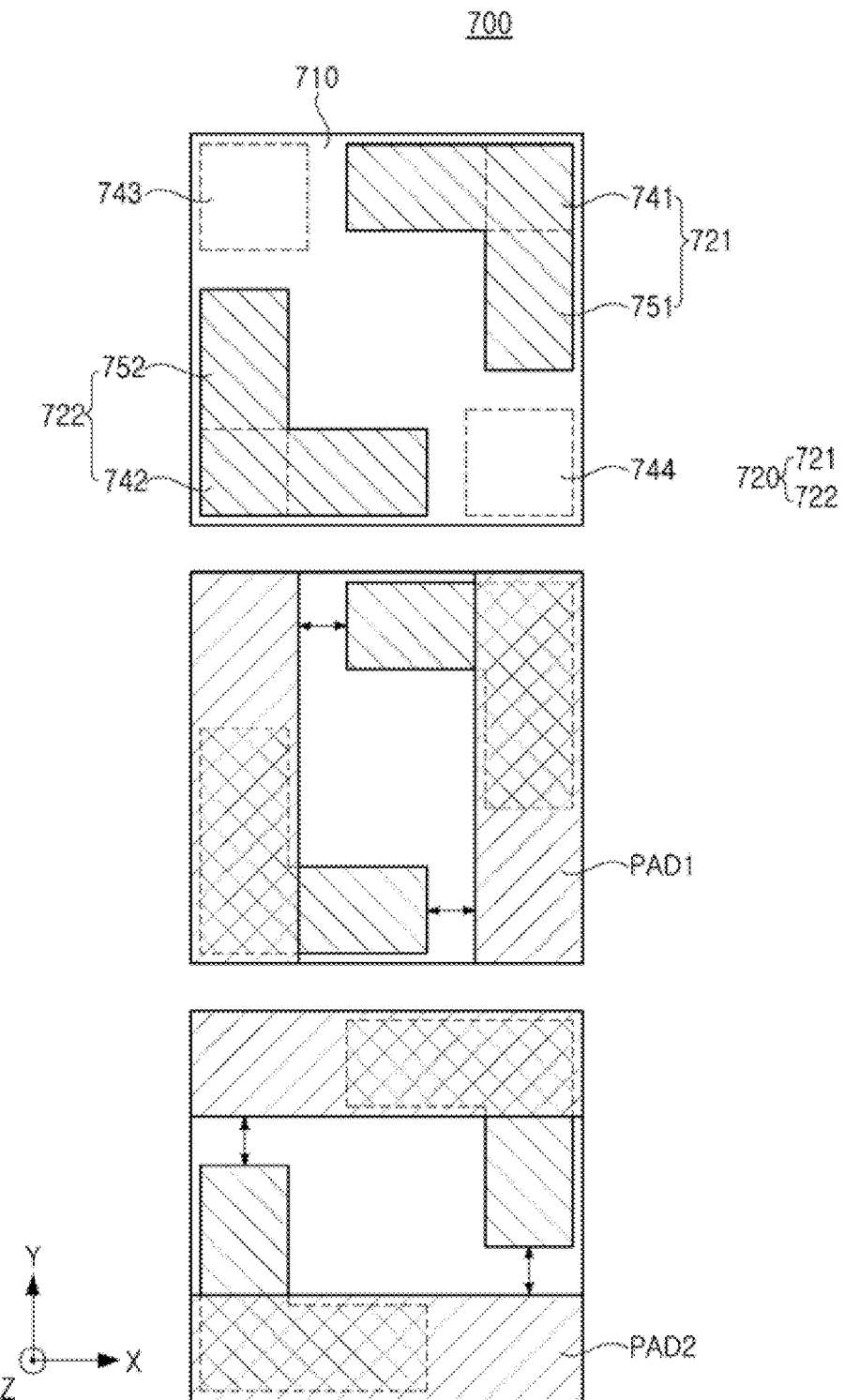
FIGS. 7 and 8 are plan views illustrating a printed circuit board according to an example embodiment and the case in which a semiconductor device or a circuit device is mounted on the printed circuit board.
Figure 8:
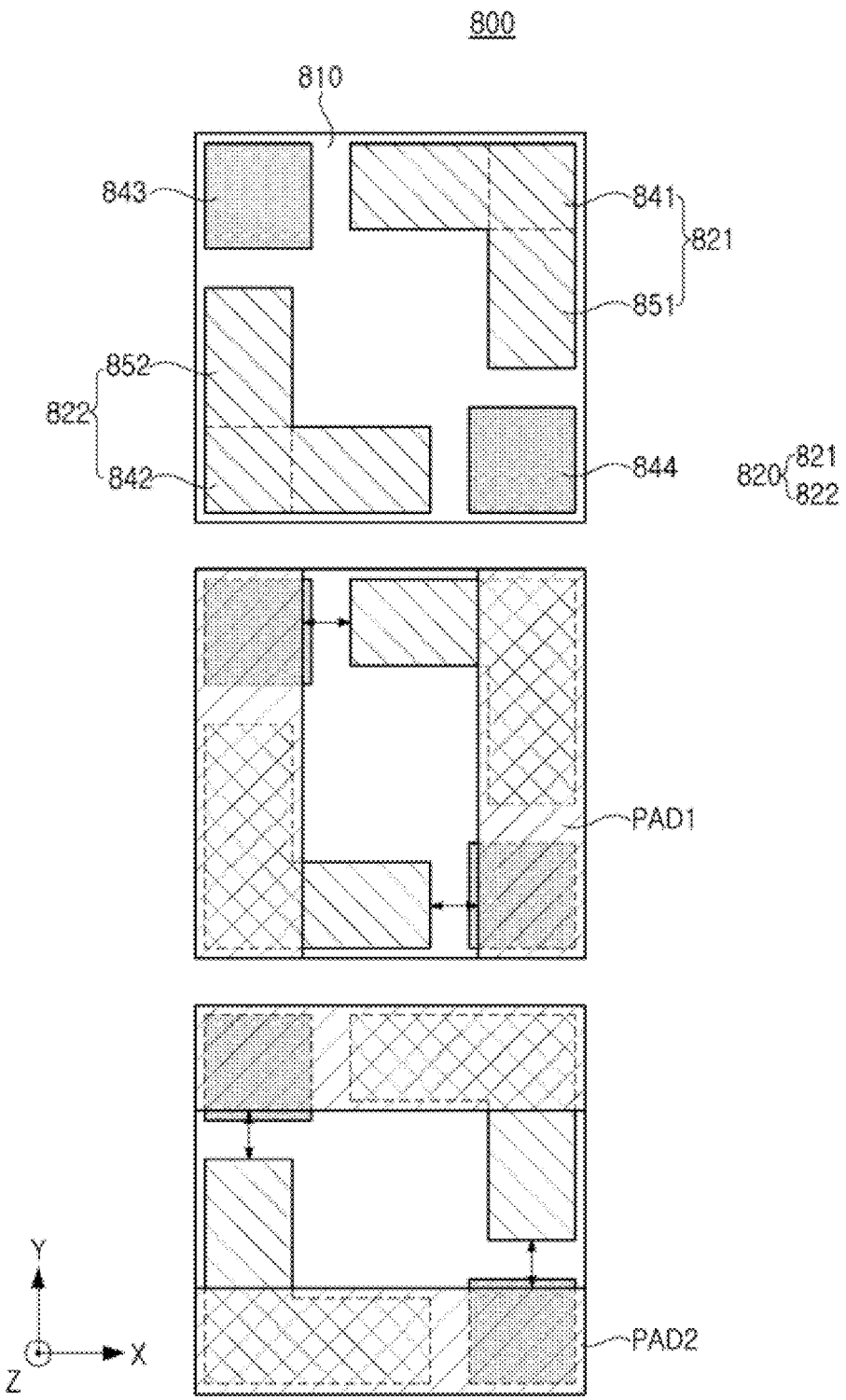

FIGS. 7 and 8 are plan views illustrating a printed circuit board according to an example embodiment and the case in which a semiconductor device or a circuit device is mounted on the printed circuit board.

Referring to FIG. 7, a printed circuit board 700 according to an example embodiment may correspond to the printed circuit board 300 illustrated in FIG. 3.

The printed circuit board 700 may include a base substrate 710 and a pad region 720 including a plurality of pad patterns disposed on one surface of the base substrate 710.

As compared with the printed circuit board 300 illustrated in FIG. 3, the printed circuit board 700 illustrated in FIG. 7 has shapes of the first sub-pad region 751 and the second sub-pad region 752 that are changed. The first sub-pad region 751 and the second sub-pad region 752 may extend from a first edge region 741 and a second edge region 742. Unlike the printed circuit board 300 illustrated in FIG. 3, the first sub-pad region 751 may extend in a direction, parallel to sides of the base substrate 710, e.g., a first direction and a second direction, to have the same width as the first edge region 741. Similarly, the second sub-pad region 752 may extend in the direction, parallel to the sides of the base substrate 710, to have the same width as the second edge region 742. The other components may correspond to those of the printed circuit board 300 illustrated in FIG. 3.

Regions adjacent to the four sides of the printed circuit board 700 may be defined as a first edge region 741, a second edge region 742, a third edge region 743, and a fourth edge region 744, respectively. The first edge region 741 and the second edge region 742 may be disposed in a diagonal direction, and the third edge region 743 and the fourth edge region 744 may be disposed in a diagonal direction.

The pad region 720 may include a first pad region 721, which includes a first edge region 741 and a first sub-pad region 751, and a second pad region 722, which includes a second edge region 742 and a second sub-pad region 752. The first pad region 721 and the second pad region 722 may be electrically separated from each other.

A semiconductor device or a circuit device may be mounted on the printed circuit board 700. In a third direction (for example, a Z direction) perpendicular to an upper surface of the base substrate 710, at least a portion of the first pad region 721 may overlap at least a portion of one electrode of the semiconductor device and the circuit device mounted on the printed circuit board 700, and at least a portion of the second pad region 722 may overlap at least a portion of another electrode of the semiconductor device and the circuit device.

When a mounting angle of the semiconductor device and the circuit device is 180 degrees or 360 degrees with respect to a side adjacent to the first edge region 741 and the third edge region 743, electrodes corresponding to a pad PAD1 of the semiconductor device or the circuit device may be electrically connected to the first pad region 721 and the second pad region 722, respectively. Even when the mounting angle of the semiconductor device or the circuit device is 90 degrees or 270 degrees with respect to the side adjacent to the first edge region 741 and the third edge region 743, electrodes corresponding to a pad PAD2 of the semiconductor device or the circuit device may be electrically connected to the first pad region 721 and the second pad region 722, respectively.

With the use of the printed circuit board 700, the electrodes corresponding to the pads PAD1 and PAD2 of the semiconductor device or the circuit device may be electrically connected to the first pad region 721 and the second pad region 722, respectively, regardless of a mounting angle at which the semiconductor device or the circuit device is mounted. Accordingly, when the semiconductor device or the circuit device, e.g., a device having the same exterior is mounted, short-circuit in which the first pad region 721 and the second pad region 722 are electrically connected to each other may be prevented regardless of the mounting angle.

Referring to FIG. 8, a printed circuit board 800 according to an example embodiment may correspond to the printed circuit board 700 illustrated in FIG. 7.

The printed circuit board 800 may include a base substrate 810 and a pad region 820 including a plurality of pad patterns disposed on one surface of the base substrate 810. The pad region 820 may include a first pad region 821, which includes a first edge region 841 and a first sub-pad region 851, and a second pad region 822, which includes a second edge region 842 and a second sub-pad region 852.

Unlike the printed circuit board 700 illustrated in FIG. 7, the printed circuit board 800 may include a dummy region formed in the third edge region 843 and the fourth edge region 844. For example, the printed circuit board 800 may include the third edge region 843 and the fourth edge region 844 and may include a dummy region having a plurality of dummy patterns separated from a plurality of pad patterns to be disposed on one surface of the base substrate 810, so that the first pad region 821 and the second pad region 822 may be electrically separated from each other more clearly and, furthermore, operational performance of the memory module including the printed circuit board 800 may be improved.

Figure 9:
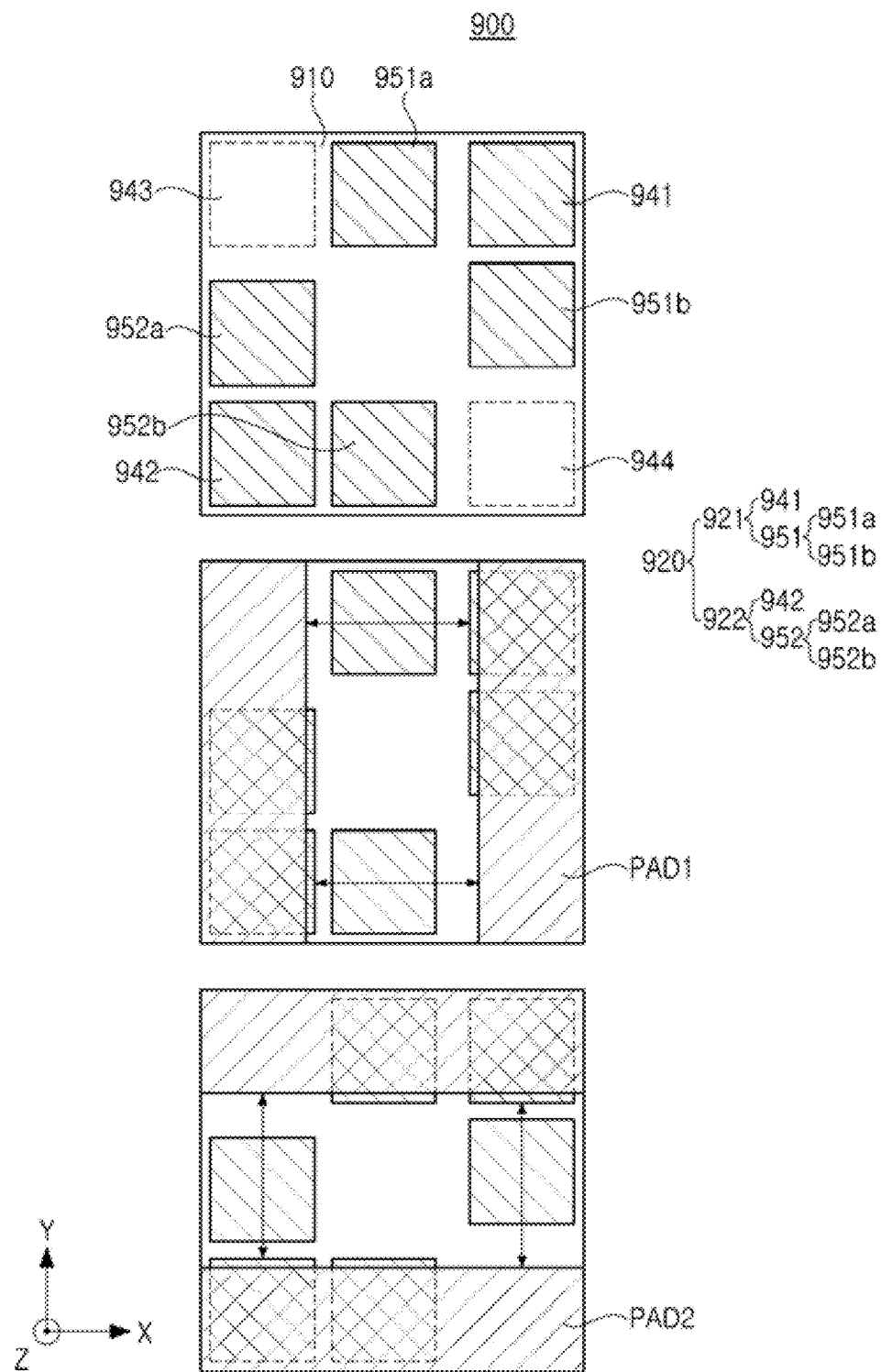
FIGS. 9 and 10 are plan views, each illustrating a printed circuit board according to an example embodiment and the case in which a semiconductor device or a circuit device is mounted on the printed circuit board.
Figure 10:
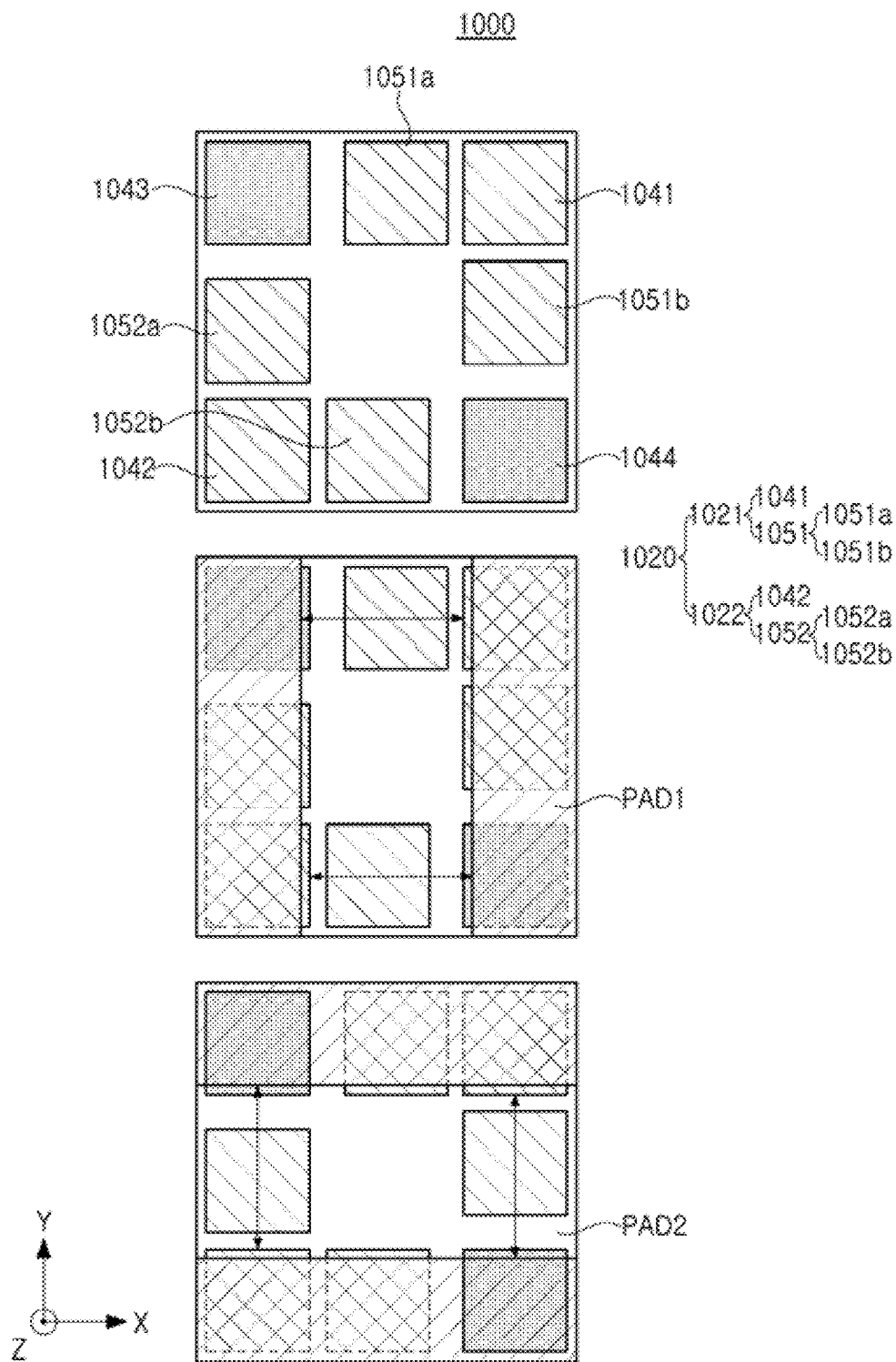

FIGS. 9 and 10 are plan views, each illustrating a printed circuit board according to an example embodiment and the case in which a semiconductor device or a circuit device is mounted on the printed circuit board.

Referring to FIG. 9, a printed circuit board 900 according to an example embodiment may correspond to the printed circuit board 300 illustrated in FIG. 3.

The printed circuit board 900 may include a base substrate 910 and a pad region 920 including a plurality of pad patterns disposed on one surface of the base substrate 910.

As compared with the printed circuit board 300 illustrated in FIG. 3, the printed circuit board 900 illustrated in FIG. 9 has shapes of a first sub-pad region 951 and a second sub-pad region 952 that are changed. The first sub-pad region 951 may include a plurality of first sub-pad regions 951 separated from a first edge region 941. Similarly, the second sub-pad region 952 may include a plurality of second sub-pad regions 952 separated from a second edge region 942. The other components may correspond to those of the printed circuit board 300 illustrated in FIG. 3.

Regions adjacent to four sides of the printed circuit board 900 may be defined as a first edge region 941, a second edge region 942, a third edge region 943, and a fourth edge region 944, respectively. The first edge region 941 and the second edge region 942 may be disposed in a diagonal direction, and the third edge region 943 and the fourth edge region 944 may be disposed in a diagonal direction.

The pad region 920 may include a first pad region 921, which includes a first edge region 941 and a plurality of first sub-pad areas regions, and a second pad region 922, which includes a second edge region 942 and a plurality of second sub-pad regions 952. The first pad region 921 and the second pad region 922 may be electrically separated from each other.

A semiconductor device or a circuit device may be mounted on the printed circuit board 900. In a third direction (for example, a Z direction) perpendicular to an upper surface of the base substrate 910, at least a portion of the first pad region 921 may overlap at least a portion of one electrode of the semiconductor device or the circuit device mounted on the printed circuit board 900, and at least a portion of the second pad region 922 may overlap at least a portion of another electrode of the semiconductor device or the circuit device.

When a mounting angle of the semiconductor device or the circuit device is 180 degrees or 360 degrees with respect to a side adjacent to the first edge region 941 and the third edge region 943, electrodes corresponding to a pad PAD1 of the semiconductor device or the circuit device may be electrically connected to the first pad region 921 and the second pad region 922, respectively. Even when the mounting angle of the semiconductor device or the circuit device is 90 degrees or 270 degrees with respect to the side adjacent to the first edge region 941 and the third edge region 943, electrodes corresponding to a pad PAD2 of the semiconductor device or the circuit device may be electrically connected to the first pad region 921 and the second pad region 922, respectively.

With the use of the printed circuit board 900, the electrodes corresponding to the pads PAD1 and PAD2 of the semiconductor device or the circuit device may be electrically connected to the first pad region 921 and the second pad region 922, respectively, regardless of a mounting angle at which the semiconductor device or the circuit device is mounted. Accordingly, when the semiconductor device or the circuit device, e.g., a device having the same exterior is mounted, a short-circuit in which the first pad region 921 and the second pad region 922 are electrically connected to each other may be prevented, regardless of the mounting angle.

Unlike the printed circuit board 300 illustrated in FIG. 3, the sub-pad regions 951 and 952 included in the printed circuit board 900 may be disposed to be separated from the edge regions 941 and 942, respectively. Accordingly, in a portion in which the pad region 920 is electrically separated from the pads PAD1 and PAD2 of the semiconductor device or the circuit device, a margin of a separation distance may be increased to improve electrical stability. At the same time, in a region in which the pad region 920 is electrically connected to the pads PAD1 and PAD2 of the semiconductor device or the circuit device, an overlapping region may be increased to improve performance of a memory module.

Referring to FIG. 10, a printed circuit board 1000 according to an example embodiment may correspond to the printed circuit board 900 illustrated in FIG. 9.

The printed circuit board 1000 may include a base substrate 1010 and a pad region 1020 including a plurality of pad patterns disposed on one surface of the base substrate 1010.

The pad region 1020 may include a first pad region 1021, including a first edge region 1041 and a plurality of first sub-pad regions 1051, and a second pad region 1022 including a second edge region 1042 and a plurality of second sub-pad regions 1052.

Unlike the printed circuit board 900 illustrated in FIG. 9, the printed circuit board 1000 may include a dummy region formed in a third edge region 1043 and a fourth edge region 1044. The printed circuit board 900 may include the third edge region 1043 and the fourth edge region 1044 and may include a dummy region having a plurality of conductive dummy patterns separated from a plurality of pad patterns to be disposed on one surface of the base substrate 1010, so that the first pad region 1021 and the second pad region 1022 may be electrically separated from each other more clearly and, furthermore, operational performance of the memory module including the printed circuit board 1000 may be improved.

Figure 11:
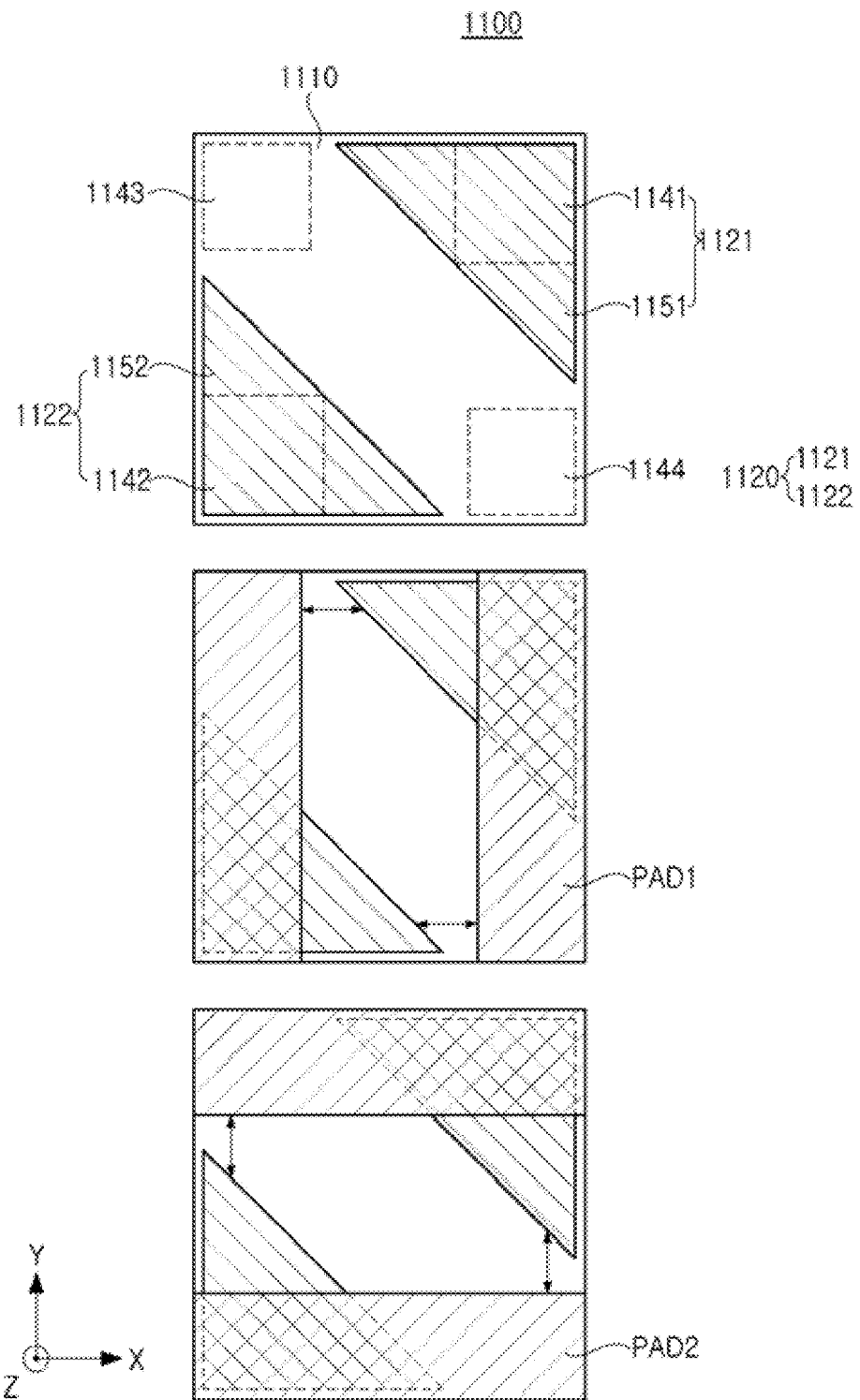
FIGS. 11 and 12 are plan views, each illustrating a printed circuit board according to an example embodiment and the case in which a semiconductor device or a circuit device is mounted on the printed circuit board.
Figure 12:
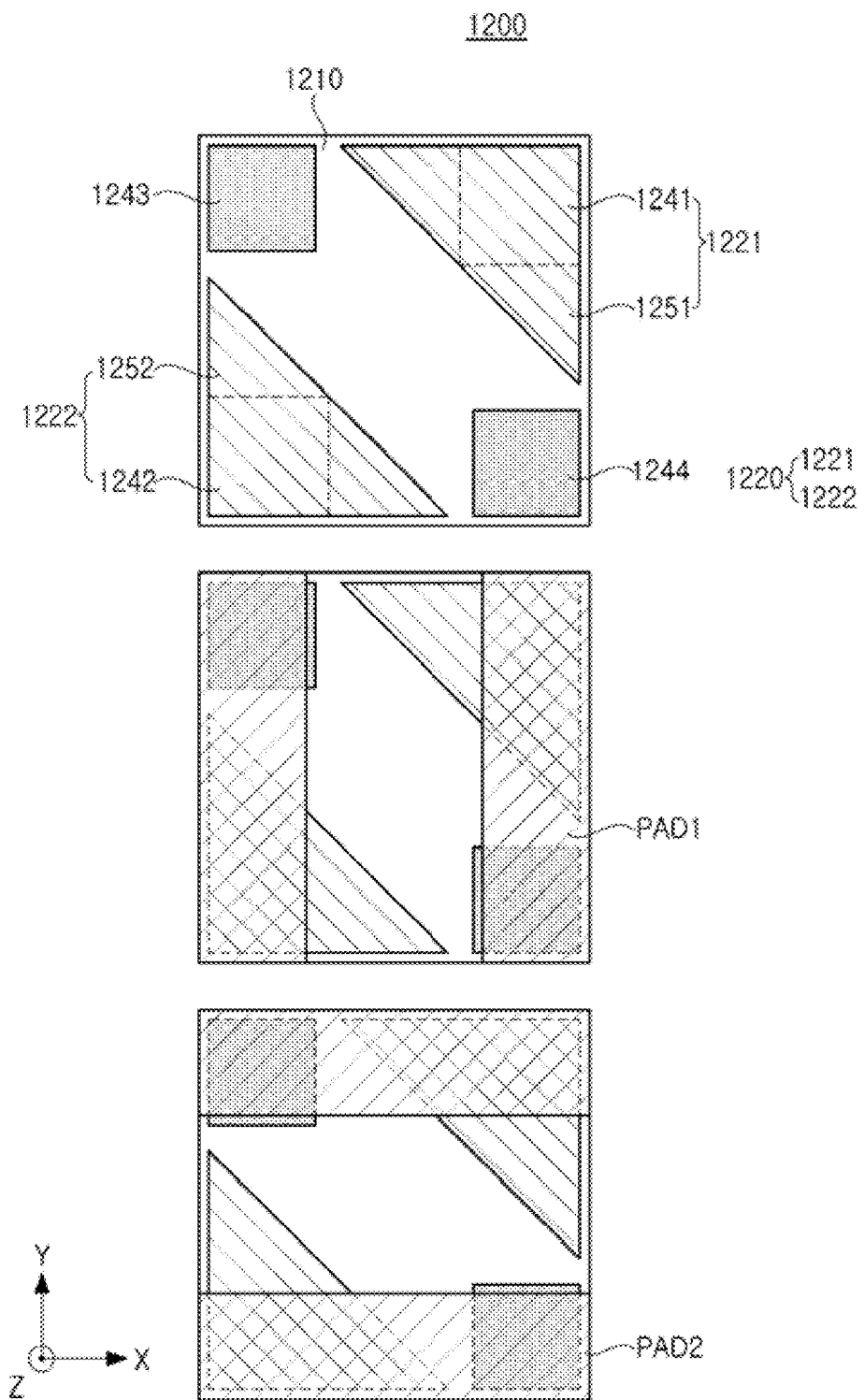

FIGS. 11 and 12 are plan views, each illustrating a printed circuit board according to an example embodiment and the case in which a semiconductor device or a circuit device is mounted on the printed circuit board.

Referring to FIG. 11, a printed circuit board 1100 according to an example embodiment may correspond to the printed circuit board 300 illustrated in FIG. 3.

The printed circuit board 1100 may include a base substrate 1110 and a pad region 1120 including a plurality of pad patterns disposed on one surface of the base substrate 1110.

As compared with the printed circuit board 300 illustrated in FIG. 3, the printed circuit board 1100 illustrated in FIG. 11 has shapes of a first sub-pad region 1151 and a second sub-pad region 1152 that are changed. In a direction parallel to an upper surface of the base substrate 1110, a width of a first pad region 1121 including the first sub-pad region 1151 and a width of a second pad region 1122 including the second sub-pad region 1152 may be greatest at an edge of the base substrate 1110. In other words, the widths of the sub-pad regions 1151 and 1152 may be decreased in a direction away from the edge regions 1141 and 1142. The other components may correspond to those of the printed circuit board 300 illustrated in FIG. 3.

Regions adjacent to four sides of the printed circuit board 1100 may be defined as a first edge region 1141, a second edge region 1142, a third edge region 1143, and a fourth edge region 1144, respectively. The first edge region 1141 and the second edge region 1142 may be disposed in a diagonal direction, and the third edge region 1143 and the fourth edge region 1144 may be disposed in a diagonal direction.

The pad region 1120 may include a first pad region 1121, including a first edge region 1141 and a first sub-pad region 1151, and a second pad region 1122 including a second edge region 1142 and a second sub-pad region 1152. The first pad region 1121 and the second pad region 1122 may be electrically separated from each other.

A semiconductor device or a circuit device may be mounted on the printed circuit board 1100. In a third direction (for example, a Z direction) perpendicular to an upper surface of the base substrate 1110, at least a portion of the first pad region 1121 may overlap at least a portion of one electrode of the semiconductor device or the circuit device mounted on the printed circuit board 1100, and at least a portion of the second pad region 1122 may overlap at least a portion of another electrode of the semiconductor device or the circuit device.

When a mounting angle of the semiconductor device and the circuit device is 180 degrees or 360 degrees with respect to a side adjacent to the first edge region 1141 and the third edge region 1143, electrodes corresponding to a pad PAD1 of the semiconductor device or the circuit device may be electrically connected to the first pad region 1121 and the second pad region 1122, respectively. Even when the mounting angle of the semiconductor device and the circuit device is 90 degrees or 270 degrees with respect to the side adjacent to the first edge region 1141 and the third edge region 1143, electrodes corresponding to a pad PAD2 of the semiconductor device or the circuit device may be electrically connected to the first pad region 921 and the second pad region 922, respectively.

With the use of the printed circuit board 1100, the electrodes corresponding to the pads PAD1 and PAD2 of the semiconductor device or the circuit device may be electrically connected to the first pad region 1121 and the second pad region 1122, respectively, regardless of a mounting angle at which the semiconductor device or the circuit device is mounted. Accordingly, when the semiconductor device or the circuit device, e.g., a device having the same exterior is mounted, short-circuit in which the first pad region 1121 and the second pad region 1122 are electrically connected to each other may be prevented regardless of the mounting angle.

As compared with the printed circuit board 300 illustrated in FIG. 3, the sub-pad regions 1151 and 1152 included in the printed circuit board 1100 may have greater widths in the vicinity of the edge regions 1141 and 1142. Accordingly, an area of each of the sub-pad regions 1151 and 1152 may be reduced to secure economical efficiency in terms of manufacturing. At the same time, an overlapping area in a portion, in which the pad region 1120 is electrically connected to the pads PAD1 and PAD2 of the semiconductor device or the circuit device, may be significantly increased to improve performance of a memory module.

Referring to FIG. 12, a printed circuit board 1200 according to an example embodiment may correspond to the printed circuit board 1100 illustrated in FIG. 11.

The printed circuit board 1200 may include a base substrate 1210 and a pad region 1220 including a plurality of pad patterns disposed on one surface of the base substrate 1210.

The pad region 1220 may include a first pad region 1221, including a first edge region 1241 and a first sub-pad region 1251, and a second pad region 1222 including a second edge region 1242 and a second sub-pad region 1252.

Unlike the printed circuit board 1100 illustrated in FIG. 1, the printed circuit board 1200 may include a dummy region formed in the third edge region 1243 and the fourth edge region 1244. For example, the printed circuit board 1100 may include the third edge region 1243 and the fourth edge region 1244 and may include a dummy region having a plurality of conductive dummy patterns separated from a plurality of pad patterns to be disposed on one surface of the base substrate 1210, so that the first pad region 1221 and the second pad region 1222 may be electrically separated from each other more clearly and, furthermore, operational performance of the memory module including the printed circuit board 1200 may be improved.

Figure 13:
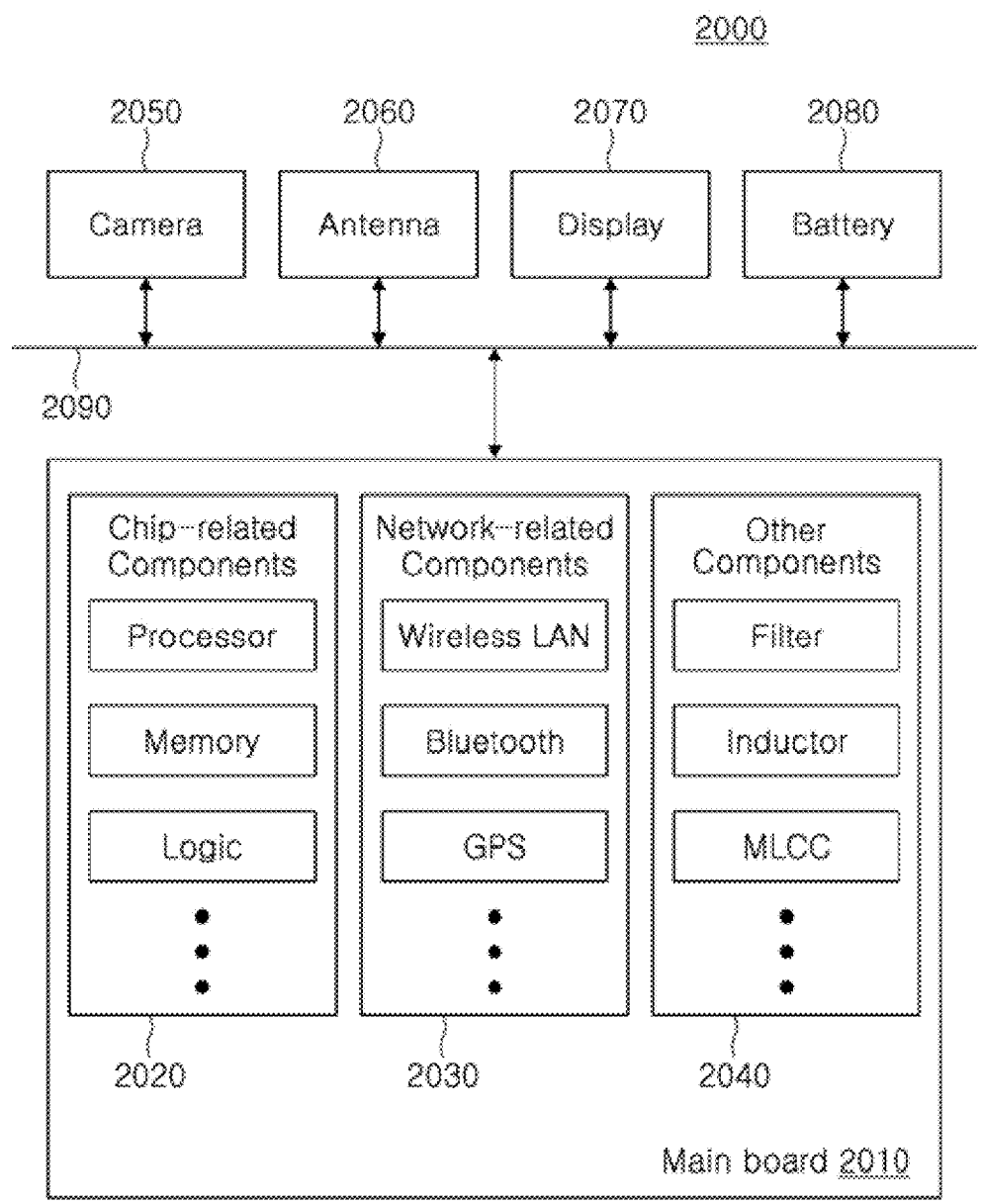
FIG. 13 is a schematic block diagram of an electronic device system including a printed circuit board according to an example embodiment.
Figure 14:
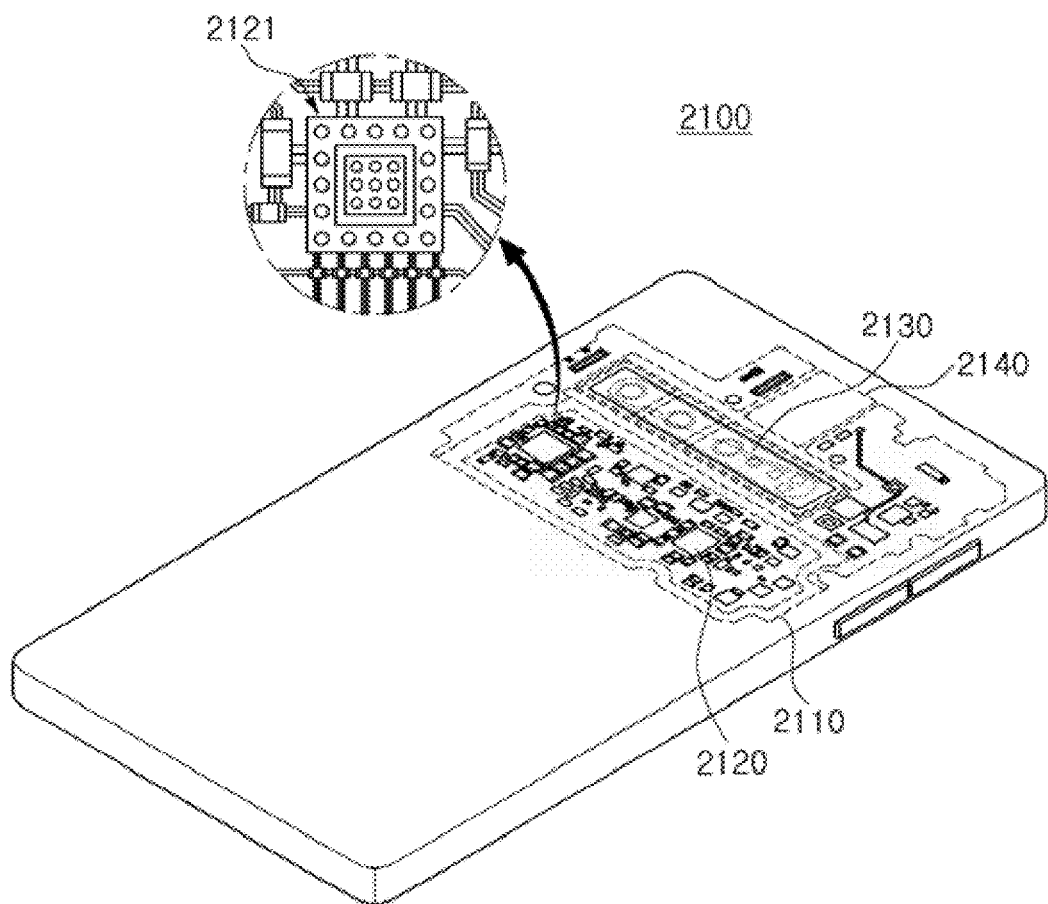
FIG. 14 is a schematic perspective view illustrating an example of an electronic device including a printed circuit board according to an example embodiment.

FIG. 13 is a schematic block diagram of an electronic device system including a printed circuit board according to an example embodiment. FIG. 14 is a schematic perspective view illustrating an example of an electronic device including a printed circuit board according to an example embodiment.

Referring to FIG. 13, an electronic device 2000 may include a mainboard 2010. The mainboard 2010 may be physically and/or electrically connected to a chip-related component 2020, a network-related component 2030, and other components 2040. According to type of the electronic device 2000, the mainboard 2010 may be connected to various electronic components, e.g., a camera module 2050, an antenna module 2060, a display 2070, and a battery 2080 through a signal line 2090.

The chip-related components 2020 may include volatile memory chips such as a flash memory chip, a dynamic random access memory (DRAM) chip, a phase change random access memory (PRAM) chip, a ferroelectric random access memory (FRAM) chip, a resistance random access memory (RRAM) chips, a magnetic random access memory (MRAM) chips, and the like.

In addition, the chip-related components 2020 may include a nonvolatile memory chip, may include an application processor chip such as a central processing unit (CPU), a graphics processing unit (GPU), a digital signal processor (DSP), a microcontroller, and the like, and may include a logic chip such as an analog-to-digital converter, an application-specific integrated circuit (ASIC), and the like. The electronic device 2000 may include various types of chip-related components 2020. The chip-related components 2020 may be combined with each other, e.g., in the form of a package including the above-described chip(s).

The network-related components 2030 may operate according to protocols such as wireless fidelity (Wi-Fi), worldwide interoperability for microwave access (WiMAX), long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, 5G protocols, and any other wireless and wired protocols designated after the above-mentioned protocols. The network-related components 2030 may also include any of a plurality of other wireless or wired standards or protocols. In addition, these components 2030 may be combined with each other, together with the chip-related components 2020 described above.

Other components 2040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), passive components used for various other purposes, or the like. The other components 2040 may be combined with each other, together with the chip-related components 21020 or the network-related components 2030 described above.

Examples of the electronic device 2000 may include a smartphone, a personal digital assistant (PDA), a digital video camera, a digital still camera, a network system, a computer, a monitor, a tablet personal computer (PC), a laptop PC, a netbook PC, a television, a video game machine, a smartwatch, an automotive, another other electronic device processing data, etc.

Referring to FIG. 14, an electronic device 2000 including a printed circuit board 2121 according to an example embodiment may be a smartphone 2100.

A motherboard 2110 may be accommodated in the smartphone 2100, and various electronic components 2120 may be physically and/or electrically connected to the motherboard 2110. In addition, a camera module 2130 and/or a speaker 2140 may be accommodated in the smartphone 2100. Some of the electronic components 2120 may be the above-described chip-related components 2020, e.g., a printed circuit board 2121 having a surface on which a plurality of electronic components are mounted.

The electronic device 2000 may be another electronic device.

As described above, a shape of a printed circuit board according to an example embodiment may be changed such that a pad region of a printed circuit board, on which a semiconductor device or a circuit device is mounted, includes edge regions disposed in a diagonal direction and does not include other edge regions disposed in a diagonal direction. Thus, electric defects may be prevented from occurring in the printed circuit board, regardless of a mounting direction of the semiconductor device or the circuit device.

In addition, electrical defects may be prevented from occurring in the printed circuit board according to an example embodiment, without improving an automated inspection apparatus or performing a marking process on a surface of a semiconductor device or the circuit device.

Example embodiments provide a printed circuit board which may prevent electrical defects from occurring, regardless of a mounting direction of a semiconductor device or a circuit device, by changing a shape of a pad region of the printed circuit board on which the semiconductor device or the circuit device is mounted.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A printed circuit board, comprising:
a base substrate having a first side and a second side, extending in a first direction and parallel to each other, and a third side and a fourth side extending in a second direction, perpendicular to the first direction, and parallel to each other;
a first pad region having a first edge region adjacent to an intersection of the first side and the third side, and first sub-pad regions separated from the first edge region disposed on one surface of the base substrate;
a second pad region having a second edge region disposed in a diagonal direction of the first edge region on the one surface of the base substrate and second sub-pad regions separated from the second edge region disposed on the one surface of the base substrate; and
a dummy region having a third edge region adjacent to an intersection of the first side and the fourth side, and a fourth edge region disposed in a diagonal direction of the third edge region on the one surface of the base substrate.

2. The printed circuit board of claim 1, wherein the first pad region and the second pad region are electrically separated from each other.

3. The printed circuit board of claim 1, wherein the first pad region includes a plurality of first pad patterns, and the second pad region includes a plurality of second pad patterns.

4. The printed circuit board of claim 3, wherein the first pad patterns and the second pad patterns are connected to pads formed on a semiconductor chip through microbumps.

5. The printed circuit board of claim 3, wherein portions of the first pad patterns and the second pad patterns are separated from pads of a semiconductor chip.

6. The printed circuit board of claim 3, wherein a portion of the first pad patterns and the second pad patterns is electrically connected to pads of a semiconductor chip.

7. The printed circuit board of claim 3, wherein in a region in which the first pad region and the second pad region are electrically connected to pads of the semiconductor chip, an overlapping region is increased to improve performance of a memory module.

8. The printed circuit board of claim 3, wherein the dummy region includes a plurality of dummy patterns.

9. The printed circuit board of claim 8, wherein the plurality of dummy patterns are separated from the first pad patterns and the second pad patterns.

10. The printed circuit board of claim 8, wherein the dummy patterns include a conductive metal layer in a predetermined ratio.

11. A printed circuit board, comprising:
a base substrate having a first side and a second side, extending in a first direction and parallel to each other, and a third side and a fourth side extending in a second direction, perpendicular to the first direction, and parallel to each other; and
a first pad region having a first edge region adjacent to an intersection of the first side and the third side and a first sub-pad region disposed on one surface of the base substrate;
a second pad region having a second edge region disposed in a diagonal direction of the first edge region on the one surface of the base substrate and a second sub-pad region disposed on the one surface of the base substrate,
wherein in a direction parallel to an upper surface of the base substrate, a width of the first pad region and a width of the second pad region are greatest at an edge of the base substrate.

12. The printed circuit board of claim 11, wherein the first pad region and the second pad region are electrically separated from each other.

13. The printed circuit board of claim 11, wherein, in a third direction, perpendicular to an upper surface of the base substrate, at least a portion of the first pad region overlaps at least a portion of one electrode of a semiconductor device or a circuit device mounted on the printed circuit board, and at least a portion of the second pad region overlaps at least a portion of another electrode of the semiconductor device or the circuit device.

14. The printed circuit board of claim 13, further comprising: a dummy region having a third edge region adjacent to an intersection of the first side and the fourth side, and a fourth edge region disposed in a diagonal direction of the third edge region on the one surface of the base substrate.

15. The printed circuit board of claim 14, wherein when a mounting angle of the semiconductor device and the circuit device is 180 degrees or 360 degrees with respect to a side adjacent to the first edge region and the third edge region, electrodes corresponding to a pad of the semiconductor device or the circuit device are electrically connected to the first pad region and the second pad region, respectively.

16. A printed circuit board, comprising:
a base substrate having a first side and a second side extending in a first direction and parallel to each other, and a third side and a fourth side extending in a second direction, perpendicular to the first direction, and parallel to each other;
a first pad region including a first edge region disposed on one surface of the base substrate and adjacent to an intersection of the first side and the third side;
a second pad region including a second edge region disposed in a diagonal direction of the first edge region on the one surface of the base substrate; and
a dummy region formed in a third edge region adjacent to an intersection of the first side and the fourth side and a fourth edge region disposed in a diagonal direction of the third edge region on the one surface of the base substrate,
wherein each of the first pad region and the second pad region has a plurality of pad patterns disposed of on the one surface of the base substrate,
wherein the dummy region has a plurality of dummy patterns separated from the pad patterns,
wherein the first pad region includes at least one first sub-pad region corresponding to the first edge region and the second pad region includes at least one second sub-pad region corresponding to the second edge region.

17. The printed circuit board of claim 16, wherein the at least one first sub-pad region is separated from the first edge region, and the at least one second sub-pad region is separated from the second edge region.

18. The printed circuit board of claim 16, wherein the at least one first sub-pad region and the at least one second sub-pad region are electrically separated from each other.

19. The printed circuit board of claim 16, wherein in a third direction perpendicular to an upper surface of the base substrate, at least a portion of the at least one first sub-pad region overlaps at least a portion of one electrode of a semiconductor device or a circuit device mounted on the printed circuit board; and at least a portion of the at least one second sub-pad region overlaps at least a portion of another electrode of the semiconductor device or the circuit device.

20. The printed circuit board of claim 19, wherein when a mounting angle of the semiconductor device and the circuit device is 180 degrees or 360 degrees with respect to a side adjacent to the first edge region and the third edge region, electrodes corresponding to a pad of the semiconductor device or the circuit device are electrically connected to the first pad region and the second pad region, respectively.

* * * * *